(12) United States Patent
Weis et al.

(10) Patent No.: US 7,244,980 B2
(45) Date of Patent: Jul. 17, 2007

(54) LINE MASK DEFINED ACTIVE AREAS FOR 8F2 DRAM CELLS WITH FOLDED BIT LINES AND DEEP TRENCH PATTERNS

(75) Inventors: Rolf Weis, Dresden (DE); Ramachandra Divakaruni, Ossining, NY (US); Larry Nesbit, Williston, VT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 157 days.

(21) Appl. No.: 10/774,827

(22) Filed: Feb. 9, 2004

(65) Prior Publication Data

US 2005/0176197 A1    Aug. 11, 2005

(51) Int. Cl.
   *H01L 29/94*    (2006.01)
(52) U.S. Cl. .................... 257/296; 257/301; 257/302
(58) Field of Classification Search ................ 257/304, 257/301, 302, 296
   See application file for complete search history.

(56) References Cited

U.S. PATENT DOCUMENTS

| | | | |
|---|---|---|---|
| 6,153,902 A | 11/2000 | Furukawa et al. | |
| 6,163,045 A | 12/2000 | Mandelman et al. | |
| 6,339,241 B1 * | 1/2002 | Mandelman et al. | ....... 257/301 |
| 6,376,324 B1 | 4/2002 | Mandelman et al. | |
| 6,406,970 B1 | 6/2002 | Kudelka et al. | |
| 6,429,068 B1 | 8/2002 | Divakaruni et al. | |
| 6,437,401 B1 | 8/2002 | Mandelman et al. | |
| 6,458,647 B1 | 10/2002 | Tews et al. | |
| 2004/0238868 A1 * | 12/2004 | Arnold et al. | ............... 257/301 |

\* cited by examiner

*Primary Examiner*—Michael Trinh
(74) *Attorney, Agent, or Firm*—Slater & Matsil, L.L.P.

(57) ABSTRACT

A memory cell is formed for a memory cell array that is comprised of a plurality of the memory cells arranged in rows and columns. Deep trenches having sidewalls is formed within a semiconductor substrate. A buried plate region adjoining a deep trench is formed within the semiconductor substrate, and a dielectric film is formed along the sidewalls of the deep trench. A masking layer is patterned such that a portion of the dielectric film is covered by the masking layer and a remaining portion of the dielectric film is exposed. An upper region of the exposed portion of the dielectric film is removed such that a trench collar is formed along a middle portion of a side of the deep trench. The deep trench is partly filled with doped polysilicon. The dopants in the polysilicon diffuse through the side of the deep trench into adjoining regions of the semiconductor substrate during subsequent thermal processing steps to form a buried strap region along a side of the deep trench. The semiconductor substrate is patterned and etched to form at least one isolation trench that adjoins the isolation trench and two of the deep trenches and includes a buried strap region. The patterning uses a mask comprised of a lines and spaces pattern such that at least one active area is defined by the isolation trench and by the deep trench. Each of the lines and the spaces extends across the memory cell array.

7 Claims, 19 Drawing Sheets

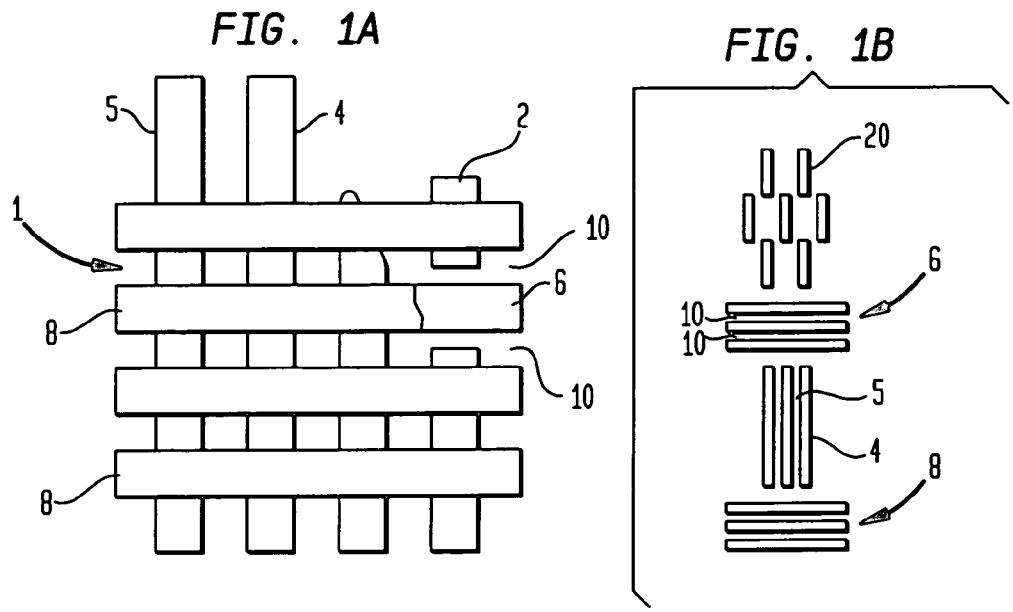
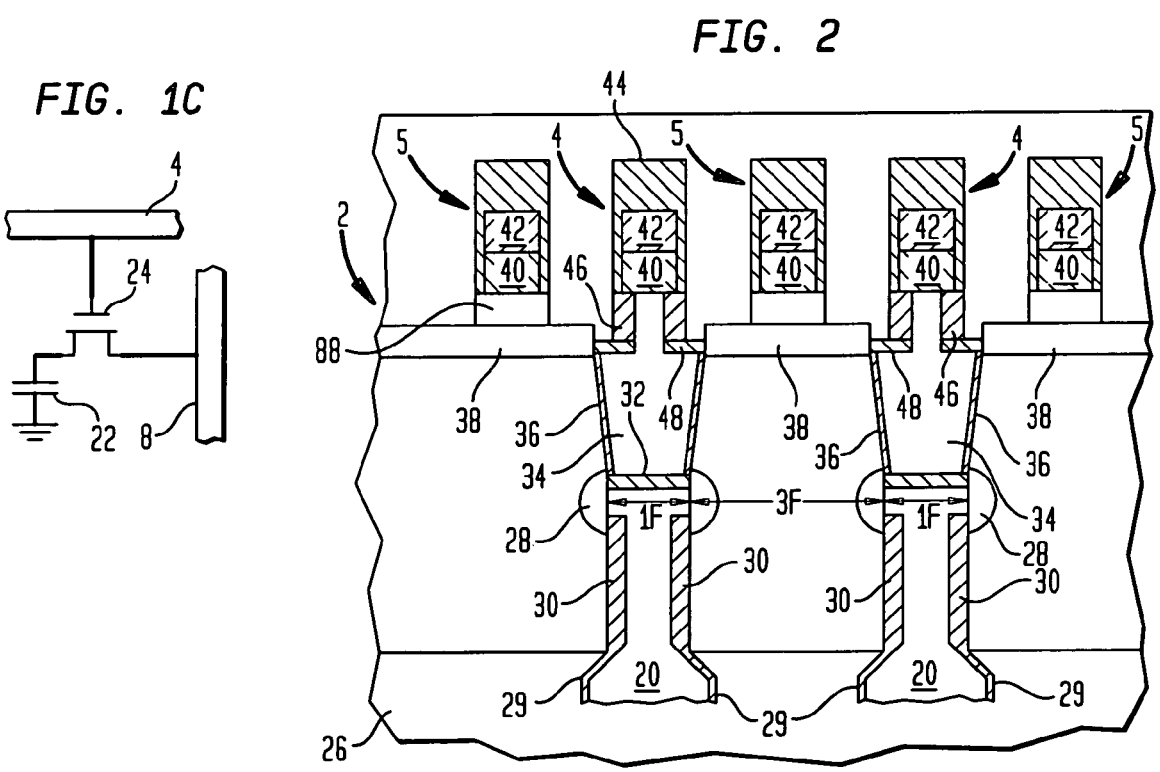

LINE MASK DEFINED ACTIVE AREAS FOR 8F2 DRAM CELLS WITH FOLDED BIT LINES AND DEEP TRENCH PATTERNS

BACKGROUND OF THE INVENTION

The present invention is directed to memory devices and, more particularly, to dynamic random access memory (DRAM) structures formed in a substrate.

Dynamic random access memory devices (DRAMs) typically include a semiconductor memory cell array formed in a plurality of memory cells arranged in rows and columns and include a plurality of bit lines as well as a plurality of word lines that intersect the bit lines. Each memory cell of the array is located at the intersection of a respective word line and a respective bit line and includes a capacitor for storing data and a transistor for switching, such as a planar or vertical MOS transistor. The word line is connected to the gate of the switching transistor, and the bit line is connected to the source or drain of the switching transistor. When the transistor of the memory cell is switched on by a signal on the word line, a data signal is transferred from the capacitor of the memory cell to the bit line connected to the memory cell or from the bit line connected to the memory cell to the capacitor of the memory cell.

When data stored in one of the memory cells is read onto one of the bit lines, for example, a potential difference is generated between the bit line of the respective memory cell and the bit line of another memory cell which form a bit line pair. A bit line sense amplifier connected to the bit line pair senses and amplifies the potential difference and transfers the data from the selected memory cells to a data line pair.

An advantage of DRAMs over other types of memory technology is their low cost because of the simplicity and scaling characteristics of the memory cell. Though the DRAM memory cell is based on simple concepts, the actual design and implementation of such cells typically requires a highly complex DRAM design and process technology.

An example of current DRAM technology is a buried capacitor DRAM memory in which memory bits are constructed in pairs to allow sharing of a bit line contact. The sharing of the bit line contact significantly reduces the overall cell size. Typically, the memory bit pair includes an active area (AA), a pair of active word lines and a pair of passing/field word lines, a bit line contact, a metal or polysilicon bit line, and a pair of cell capacitors.

The bit line pitch, i.e., the width of the bit line plus the distance between adjacent bit lines, typically determines the active area pitch and the capacitor pitch. The active area width is typically adjusted to maximize the transistor drive and minimize the transistor-to-transistor leakage.

The word line pitch typically determines the space available for the bit line contact, the transistor length, the active area space, and the capacitor length and width. Each of these dimensions must be optimized to maximize device capacitance, minimize device leakage and maximize process yield.

A common memory bit is known as an eight square feature or 8F2 cell. By definition, the feature size is the minimum realizable dimension for a given process. In practice, however, the feature size is one-half of the word line (row) pitch or bit line (column) pitch. As an example, a 0.25 µm process having word line and bit line pitches of 0.6 µm typically provides a memory bit size that is $8 \cdot (0.3 \mu m)^2 = 0.72 \mu m^2$. The 8F2 designation is best explained by traversing along the outer boundary of a memory cell. Traversing along one axis, the path includes one-half of a bit line contact feature, one word line feature, one capacitor feature, one field polysilicon feature, and one-half of a polysilicon space feature, for a total of 4 feature lengths. Along another axis that is perpendicular thereto, the path includes two one-half field oxide features and one active area feature for a total of two feature lengths. The area of the memory bit is therefore $4F \cdot 2F = 8F^2$, also referred to as 8F2.

The folded array architecture always produces an 8F2 memory bit because each word line connects, namely forms a crosspoint, with a memory bit transistor on every other bit line and passes around the memory bit transistors as a field polysilicon layer on the remaining bit lines. The field polysilicon layer in each memory bit cell adds two square features to what otherwise is a 6F2 cell. Though the folded array yields a cell that is 33% larger than the 6F2 array architectures, the folded array results in superior signal-to-noise performance, especially when combined with bit line folding.

The 8F2 folded array architecture has the disadvantage, however, that its active areas are delimited by isolation trenches that are defined by mask patterns comprised of segmented lines. As semiconductor devices become increasingly smaller, the segmented line mask patterns likewise are smaller and become increasingly difficult to print because of line shortening effects and because of the limited size of the open areas that can be printed using the masks.

Further, as devices become smaller, the vertical transistors become increasingly prone to problems caused by cross-talk between the vertical transistors, such as back-gating and floating wells.

Moreover, as the devices become smaller, the bit line-to-word line capacitance and the bit line-to-bit line capacitance increase because of increased wrapping of the bit line contact regions around the word line.

It is therefore desirable to provide a DRAM structure and fabrication process that avoids these problems.

SUMMARY OF THE INVENTION

The present invention provides a 8F2 folded bit line DRAM cell with regularly spaced deep trench patterns in which a line mask with equal lines and spaces are used to define the active areas and in which vertical transistors may be formed along only one side of the trenches or alternating between the sides of adjacent trenches using a cut mask.

In accordance with an aspect of the invention, a memory cell for a memory cell array is formed. At least two deep trench structures are formed within a semiconductor substrate. At least one of the two deep trench structures is in electrical contact with a buried strap region formed in the substrate that adjoins the one trench structure. The semiconductor substrate is patterned and etched to form at least one isolation trench that adjoins the two deep trenches. The patterning uses a mask comprised of a continuous lines and spaces pattern such that at least one active area is defined by the isolation trench and by the deep trenches. The active area includes the buried strap region. Each of the lines and the spaces extends across an entire length of the memory cell array.

According to another aspect of the invention, a buried strap region is formed in a memory cell of a memory cell array. A deep trench is formed within a semiconductor substrate, and a dielectric film is formed along the sidewalls of a deep trench. A masking layer is patterned such that a portion of the dielectric film is covered by the masking layer, and a remaining portion of the dielectric film is exposed. An upper portion of the exposed portions of the dielectric film is removed such that a trench collar is formed along an upper portion of a side of the deep trench. The deep trench is partly filled with doped polysilicon, and the dopants in the polysilicon diffuse through the side of the deep trench not covered with the dielectric film into adjoining regions of the semiconductor substrate during subsequent thermal processing steps to form the buried strap region along a side of the deep trench.

According to a further aspect of the invention, a contact structure to a first terminal of a vertical transistor in a semiconductor substrate is formed. The first terminal is disposed in a surface of the semiconductor substrate adjacent to one side of a deep trench formed in the semiconductor substrate. The vertical transistor further has a gate insulator located along an upper portion of the one side of the deep trench with a top end located adjacent to the first terminal, a gate contact region filling the upper portion of the deep trench, and a further terminal that includes a buried strap region formed along the one side of the deep trench at a bottom end of a gate insulator. The gate contact region is electrically connected to an insulated electrode formed atop the semiconductor substrate. A further side of the deep trench is insulated from the semiconductor substrate by an insulating film. A first insulator is formed atop the surface of the semiconductor substrate and extends up to a top surface of the insulated electrode. A further insulator layer is deposited atop the first insulator layer and atop the insulated electrode. The further insulator layer and the first insulator layer are patterned and etched to form at least one first opening therein that extends down to the first terminal. A remaining portion of the first insulator layer covers the further side of the deep trench. The further insulator layer is patterned and etched to form at least one further opening therein that extends from a top surface of the further insulator layer down to the first opening. The first opening and the further opening are filled with a conducting material.

According to a still further aspect of the invention, a bit line contact structure to a memory cell of a memory cell array is formed. The memory cell includes a vertical transistor and a storage capacitor. The vertical transistor has a first terminal disposed in a surface of a semiconductor substrate adjacent to one side of a deep trench formed in the semiconductor substrate, a gate insulator located along an upper portion of the one side of the deep trench with a top end located adjacent to the first terminal, a gate contact region filling the upper portion of the deep trench, and a further terminal that includes a buried strap region formed along the one side of the deep trench at a bottom end of a gate insulator. The storage capacitor has a buried plate formed in the semiconductor substrate and a further plate formed in the deep trench that is electrically coupled to the buried strap region. The gate contact region is electrically connected to an insulated word line formed atop the semiconductor substrate. A further side of the deep trench is insulated from the semiconductor substrate by an insulating film. A first insulator is formed atop the surface of the semiconductor substrate and extends up to a top surface of the insulated word line. A further insulator layer is deposited atop the first insulator layer and atop the insulated word line. The further insulator layer and the first insulator layer are patterned and etched to form at least one first opening therein that extends down to the first terminal. A remaining portion of the first insulator layer covers the further side of the deep trench. The further insulator layer is patterned and etched to form at least one further opening therein that extends from the top surface of the further insulator layer down to the first opening. The first opening and the further opening are filled with a conducing material.

According to yet another aspect of the invention, a memory cell is formed for a memory cell array. At least two deep trenches are formed within a semiconductor substrate, and a buried plate region is formed adjoining a bottom region of at least one of the deep trenches within the semiconductor substrate. A dielectric film is formed along sidewalls of the at least one deep trench, and a masking layer is patterned such that a portion of the dielectric film is covered by the masking layer and a remaining portion of the dielectric film is exposed. An upper portion of the exposed portion of the dielectric film is removed such that a trench collar is formed along an upper portion of a side of the at least one deep trench. The deep trench is at least partly filled with doped polysilicon. The dopants in the polysilicon diffuse through the side of the at least one deep trench not covered with the dielectric film into an adjoining region of the semiconductor substrate during subsequent thermal processing steps to form a buried strap region along a side of the deep trench. A trench top oxide layer is formed atop the doped polysilicon, and a gate dielectric layer is formed on the side of the at least one deep trench. The at least one deep trench is filled with a further polysilicon layer atop the trench top oxide layer. The semiconductor substrate is patterned and etched to form at least one isolation trench that adjoins the two deep trenches. The patterning uses a mask comprised of a continuous lines and spaces pattern such that at least one active area is defined by the adjacent isolation trenches and by the two deep trenches and includes the buried strap region. Each of the lines and spaces extends across the entire length of the memory cell array. A doped region is formed in the top surface of the semiconductor substrate adjacent to gate dielectric layer of the at least one deep trench. A contact region is formed to the further polysilicon layer that connects the further polysilicon layer to word line. A first insulator layer is deposited atop the surface of the semiconductor substrate and is planarized to the top surface of the insulated word line. A further insulated layer is deposited atop the first insulator layer and atop the insulated word line. The further insulated layer and the first insulated layer are patterned and etched to form at least one first opening therein that extends down to the first terminal. A remaining portion of the first insulator layer covers the further side of the deep trench. The further insulator layer is patterned and etched to form at least one further opening therein that extends from a top surface of the further insulator layer down to the first opening and leaves a region of the further insulator layer atop the remaining portion of the first insulator layer and atop at least part of the insulated word line. The first opening and the further opening are filled with a conducting material to form a bit line contact.

In accordance with a further aspect of the invention, a memory cell, a buried strap forming structure and a contact structure are formed in the manner described above.

The foregoing aspects, features and advantages of the present invention will be further appreciated when considered with reference to the following description of the preferred embodiments and accompanying drawings.

BRIEF DESCRIPTION OF THE DRAWINGS

FIGS. 1A and 1B illustrate, in plan view, a memory device architecture, and FIG. 1C is a schematic diagram of a memory cell.

FIG. 2 shows a cross-sectional view of a known memory cell taken through the active region.

DETAILED DESCRIPTION

Figure 3:
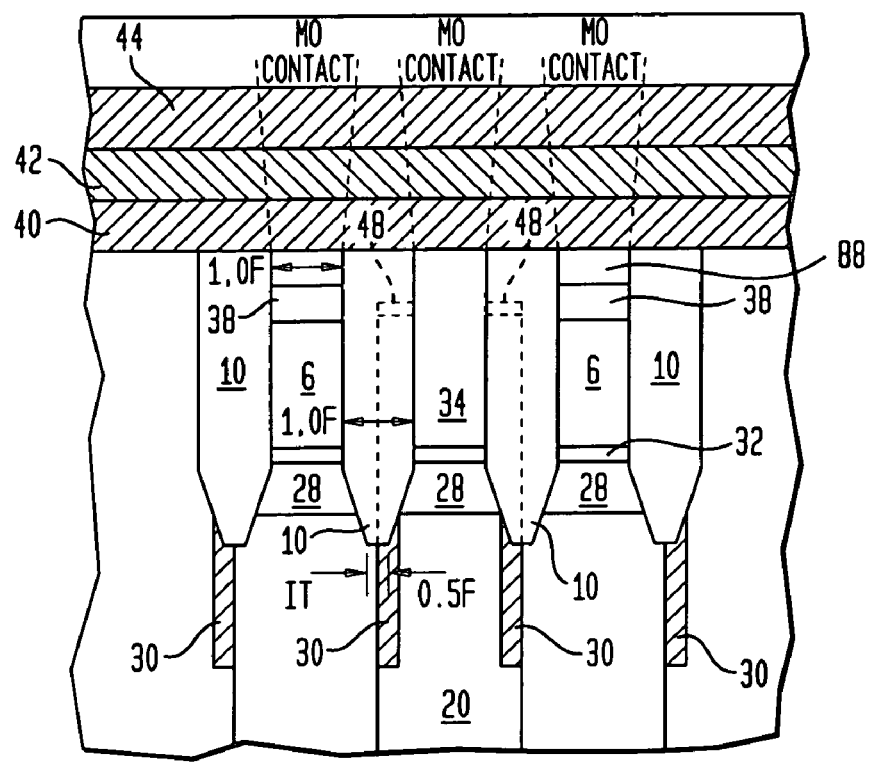
FIG. 3 shows a cross-sectional view of a known memory cell taken perpendicularly to the axis of the active region.

FIGS. 1A and 1B illustrate, in plan view, an 8F2 DRAM memory cell array comprised of plural memory cells. Examples of 8F2 DRAM cells and processes for fabricating such DRAM cells are described in U.S. application Ser. No. 09/888,202, filed Jun. 22, 2001, the disclosure of which is incorporated herein by reference.

FIG. 1A shows various mask patterns of a memory cell array superimposed on one another. FIG. 1B shows each mask pattern of FIG. 1A separately, namely FIG. 1B represents the view of FIG. 1A at four different depths. The topmost pattern of FIG. 1B illustrates an arrangement of a plurality of deep trenches 20. The second pattern from the top in FIG. 1B illustrates the arrangement of the active areas in which doped junctions used for pass transistors are formed. The third pattern from the top illustrates the arrangement of the gate contact patterns or word lines of the cell array, and the bottom pattern illustrates the arrangement of the bit lines of the array.

As described above, the four patterns of FIG. 1B are shown in FIG. 1A superimposed atop one another to form the memory cell array 1. The array 1 is comprised of an arrangement of memory cells 2. Each cell 2 is contacted by two word lines 4 and 5 and by one bit line 8. The cell is comprised of an active area (AA) region formed of silicon or polysilicon 6 which is contacted by the bit line 8 which is comprised of a metal, such as tungsten or highly doped polysilicon. Each AA region is electrically isolated from the next AA region by an isolation trench (IT) 10 which is preferably a trench filled with a field oxide.

The cell 2 is further comprised of a deep trench (DT) region 20 wherein a trench capacitor and a vertical transistor are formed. The deep trench also divides the AA regions. The bit line 8 contacts the AA region on each side of the deep trench at a location where the AA region forms the drain of the pass transistor. The word line 4 passes between the AA regions at a location above the deep trench regions, namely where the AA region is interrupted, to contact the gate of the vertical transistor formed within the trench.

FIG. 1C is a schematic diagram of a known memory cell 2. The cell is comprised of a charge storage capacitor 22 having one plate tied to a reference voltage, which is typically ground or one-half of the bit line voltage, and having its other plate tied to the source of a pass transistor 24. The pass transistor 24 has a drain tied to bit line 8 and a gate tied to word line 4.

FIG. 2 is a cross-sectional view of a known memory cell 2 taken through the AA region shown in FIG. 1. The charge storage capacitor 22 and the source of pass transistor 24 shown in FIG. 1C are formed within the deep trench 20. The gate of the pass transistor 24 is formed within the upper region of the deep trench 20 above a trench top oxide (TTO) 32. Drain regions for the pass transistor 24 are formed on both sides of the deep trench 20.

A buried plate or buried region 26 forms one plate of the capacitor 22. The buried plate 26 is typically a heavily doped region, preferably n-type, that is formed within a bulk p-type semiconductor substrate. Alternatively, the buried plate 26 is a p-type region formed within an n-type bulk substrate or formed within an n-type well formed within a p-type substrate. A thin dielectric layer 29, such as an oxide or nitride layer or a combination of both or another high-k material, is formed around the periphery of the deep trench 20 and forms the capacitor dielectric. Doped, preferably n-type polysilicon formed within the lower region of the deep trench 20 comprises the other plate of storage capacitor 22. The deep trench 20 also adjoins a heavily doped buried strap region 28 which forms a first doped junction for the pass transistor 24, typically the source region. The buried strap is electrically connected to the n-doped polysilicon formed within the lower region of the deep trench 20, thus forming the connection between the pass transistor 24 and the charge storage capacitor 22. The deep trench 20 also preferably includes a trench collar oxide 30 and a trench top oxide 32 for preventing parasitic current leakages.

In addition to the buried strap source region 28, the pass transistor 24 also includes a doped polysilicon gate region 34 formed within the upper region of the deep trench 20 and the gate oxide 36. The gate oxide 36 is formed on both sides around the polysilicon region 34 in the upper part of trench 20. The pass transistor also includes a drain region 38 which is also formed on both sides of the trench. In this way, the overall gate width is doubled for a given gate length, because the transistor provides two source-to-drain paths, one on each side of the deep trench. Each drain region 38 is connected to the bit line 8 (not shown in FIG. 2) via bit line contacts.

The gate polysilicon region 34 is contacted by the active word line (AWL) 4. The other word lines 5 also shown in FIG. 2 are connected to other memory cells (not shown), which are referred to as passing word lines (PWL). The word lines 4 and 5 include a low resistive conductor layer atop an optional barrier layer, such as a dual layer conductor formed of a first tungsten nitride (WN) or polysilicon/WN layer 40 over which is formed a tungsten or tungsten silicide (WSi) layer 42. The conductive layers are surrounded by a nitride insulating layer 44 to insulate the word lines from the bit line contacts 81 (shown in FIG. 6H) and from the bit line. Additionally, the gate region 34 is insulated from its adjacent regions, such as from the doped regions 38, by a spacer layer 46 and a cap layer 48. The spacer layer 46 is typically formed of an oxide layer, and the cap layer 48 is typically formed of a nitride layer, though other materials may be substituted. The passing word line 5 is insulated from the doped drain regions 38 by an array top oxide (ATO) 88.

FIG. 3 depicts a cross-sectional view of the memory cell 2 taken perpendicular to the view of FIG. 2, i.e., along the word line 5. The deep trench 20 is illustrated at the center of FIG. 3 as is the trench collar oxide region 30. Four isolation trenches 10 are also illustrated. The isolation trenches are formed between the active regions and separate the bit line contacts from one another. Traversing from left to right in FIG. 3, along word line 5, an isolation trench 10 is first shown, followed by an active area region 6, followed by the deep trench region 20, another isolation trench 10, another active region 6, and so on.

The buried strap region 28 appears to be inside the deep trench region of FIG. 3 but is actually out-diffused from the polysilicon region of the deep trench into the surrounding bulk region of active regions 6. A trench top oxide region 32 is visible inside the deep trench 20 but is shown in the bulk silicon of the active regions 6. Similarly, the doped drain junctions 38 and the ATO 88 are shown in FIG. 3, but these regions are actually behind or in front of the cross-section view illustrated in FIG. 3. Although the nitride cap 48 together with the upper part of the trench 20 are illustrated in the IT region 10, the regions are actually etched away when the IT is etched. The gate oxide 36 is similarly disposed parallel to the plane of the paper in the perspective of FIG. 3 and would not ordinarily be visible. The word line includes a polysilicon layer 40, a tungsten layer 42, and a nitride cap 44. Also shown in phantom line are the bit line (M0) contacts by which the bit line contacts the drain regions 38 of the pass transistor.

Referring back to FIG. 2, each cell is comprised of two transistors. Each of the transistors shares a common gate region 34, but has its own gate oxide 36, source or first doped junction region 28, and drain or second doped junction region 38. The arrangement could also be considered to be a single transistor, operating under a single control signal, but having its source, gate oxide, and drain physically separated into two distinct regions. The drain region 38 of each transistor includes two contact regions (not shown) to the bit line 6. The logical pass transistor hence has four contacts to the bit line. Also, each pass transistor shares a common doped junction region, namely the drain region 38, with a neighboring transistor.

A process flow for forming the known memory cell is described with reference to FIGS. 4A through 4E, FIGS. 5A and 5B, and FIGS. 6A through 6I.

Figure 4A:
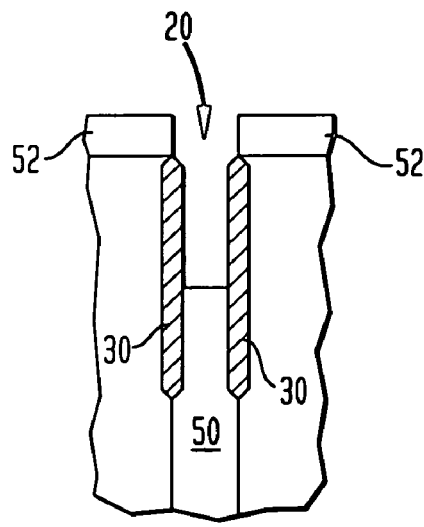
FIGS. 4A through 4E illustrate steps of a known process for fabricating memory cells and arrays.

First, a pad oxide layer (not shown) and a pad nitride layer 52 are deposited atop the substrate, and then a hard mask layer (not shown) is deposited atop the nitride layer 52. The hard mask layer and the pad nitride layer are then patterned and etched using a lithographic step, and the hard mask layer is then used to mask the etching of the deep trench 20. Next, the hard mask layer is removed, and a doped glass layer is deposited along the walls and bottom of the trench as well as atop the nitride layer 52. A further lithographic step is then carried out to pattern and remove the doped glass from atop the nitride layer and from the walls of the upper portion of the trench. An oxide cap is then deposited over the remaining portion of the doped glass, as well as over the walls of the rest of the trench and atop the nitride layer, and an anneal step is carried out to drive dopants from the doped glass into the silicon substrate and form a buried plate. The oxide cap and the doped glass are then removed, and a thin dielectric layer 29, shown in FIG. 2, is deposited along the sides of the trench. The lower portion of the trench is filled with polysilicon to form part of the polysilicon region 50. The top surface of the device is then planarized to remove any portion of the polysilicon that is atop the nitride layer, and the polysilicon is recessed to the intended depth of the collar. The dielectric film is removed from the exposed upper portion of the trench, and the trench collar oxide layer 30 is then deposited and etched back to remove any portion of the trench collar oxide layer that is atop the nitride layer 52. The remainder of the polysilicon layer 50 is next deposited, and the device is again planarized to remove any polysilicon that is atop the nitride layer 52. The nitride layer 52 protects the surrounding silicon during the polysilicon etch step. In FIG. 4A, the deep trench 20 and the trench collar oxide layer 30 are shown. The trench is shown partly filled with the polysilicon 50 that has been recessed back to a desired level within the trench as described above.

Figure 4B:
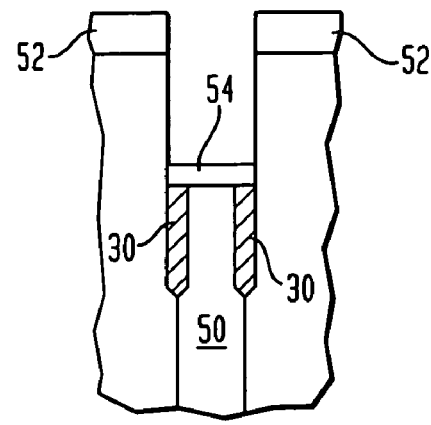

The trench collar oxide is recessed back as shown in FIG. 4B, preferably using a wet etch step. The oxide recess forms a divot at a location where the collar oxide is removed below the level of polysilicon fill 50. An optional thin oxidation or nitride deposition can also be performed. The divot is then filled by again filling the trench with polysilicon 54 and then recessing the polysilicon 54 to the desired level. The polysilicon region 54 is subsequently doped in high temperature processing steps by the region 50 and the dopant subsequently out-diffuses into the substrate to form the buried strap region 28.

Figure 4C:
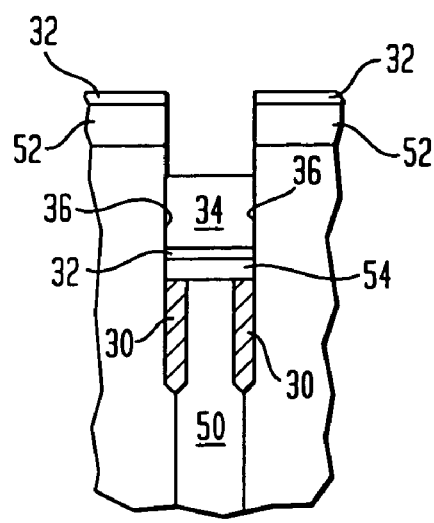

A trench top oxide layer 32 is then formed, as FIG. 4C shows, by first forming a sacrificial oxide layer (not shown) on the sidewalls of the deep trench 20 above the region of polysilicon 54. The trench top oxide (TTO) layer 32 is then deposited using a high density plasma (HDP) process followed by a wet etch back so that the layer 32 remains on the horizontal surfaces. Optionally, a nitride wet etch can be performed to remove the overhang of the nitride layer 52 in the trench 20. After formation of the TTO layer 32, the sacrificial oxide layer is removed from the sidewalls of the trench, thus providing a clean deep trench sidewall surface for subsequent growing of a gate oxide layer 36. After the gate oxide layer 36 is formed, a gate polysilicon layer 34 is deposited within the deep trench, polished by a chemical mechanical polish (CMP) step and then recessed. Preferably, the deep trench is overfilled with the polysilicon and is followed by a CMP step down to the top of the nitride layer 52. The polysilicon is then etched below the surface of the bulk silicon surrounding deep trench 20. The recess depth is a matter of design choice provided that the recess is within the junction depth of the drain 38 to insure junction to gate overlap.

Figure 4D:
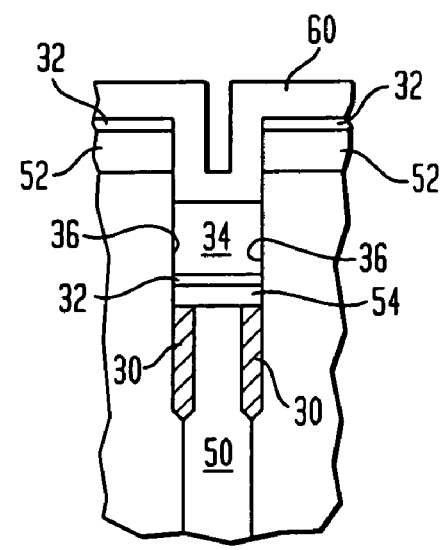

As shown in FIG. 4D, the exposed surfaces of the bulk silicon and of gate polysilicon 34 are then oxidized to form a thin oxide layer, not shown. A nitride liner layer 60 is then formed.

Figure 4E:
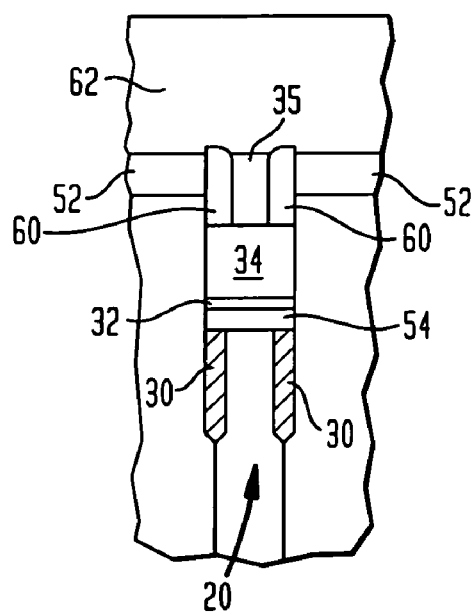

FIG. 4E illustrates a subsequent step in which portions of the nitride liner 60 is etched back to leave a nitride spacer. An oxide clean step then removes any oxide from the exposed surface of gate polysilicon 34. The portions of the TTO layer 32 that are formed atop the nitride layer 52 may also be removed concurrently if not stripped earlier. Additional doped polysilicon is next deposited atop the gate polysilicon region 34, resulting in a polysilicon stud 35 which is preferably in electrical contact with the gate polysilicon layer 34. Preferably, the polysilicon stud layer 35 is overfilled and then wet etched back or, alternatively, subjected to a CMP planarizing step. A hard mask layer 62 is then deposited over the region to protect the trench during subsequent active area processing.

Figure 5A:
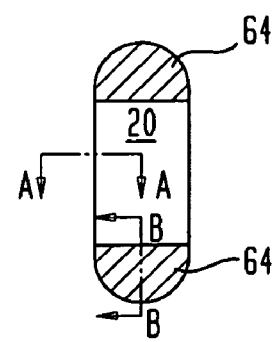
FIGS. 5A and 5B provide plan view detail of a deep trench formed in the active region of the known memory cell fabrication process.

FIG. 5A shows a top-down view of the deep trench 20 prior to the formation of an isolation trench (IT) 10. The deep trench 20 initially extends beyond the boundaries of the overlying active area 6 into what is to become part of the isolation trench region shown by the crosshatched regions 64.

Figure 5B:
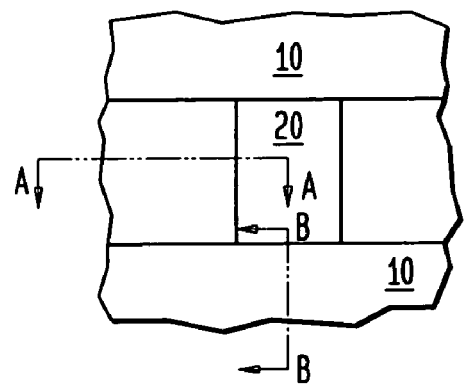

FIG. 5B illustrates the deep trench 20 after the isolation trench 10 is etched. The crosshatched regions 64 and the surrounding silicon have been etched away leaving the active region 6 and the deep trench 20 now bounded on both sides by the isolation trench 10.

Lines A-A and B-B in FIGS. 5A and 5B define two cross-sectional perspectives provided in FIGS. 6A through 6I. The portion of FIGS. 6A through 6I to the left of the dotted vertical line is taken along the axis of bit line region, along the active area (AA) region and corresponds to the perspective along line A-A in FIG. 5B. The portion of FIGS. 6A through 6I to the right of the dotted vertical line is taken perpendicular to the bit line region and corresponds to the perspective along line B-B in FIG. 5B.

Figure 6A:
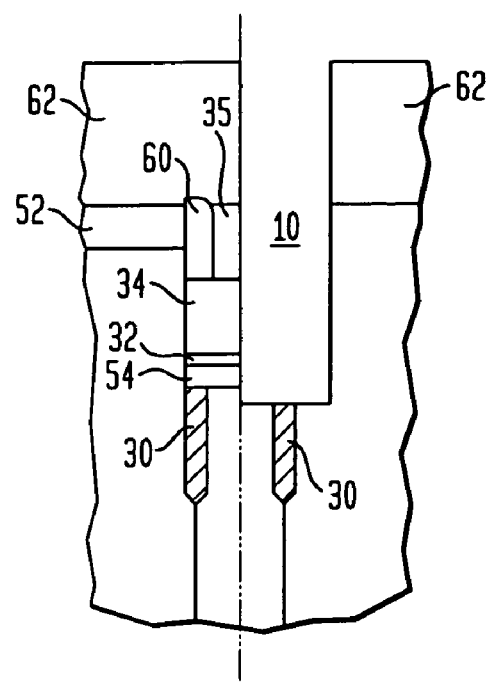
FIGS. 6A through 6I illustrate additional known process steps for fabricating memory cells and arrays.

As described above with reference to FIG. 4B, the portion of the deep trench 20 underlying the bit line region is covered by the hard mask 62 before the isolation trench is etched. The portions lying outside the active regions and the surrounding silicon are exposed, as shown in FIG. 6A, including portions 64 of the deep trench shown in FIG. 5A. The exposed portion are etched, thereby forming the isolation trench 10 which truncates the upper and lower edges of the deep trench 20 by removing the regions 64 shown in FIG. 5A.

Figure 6B:
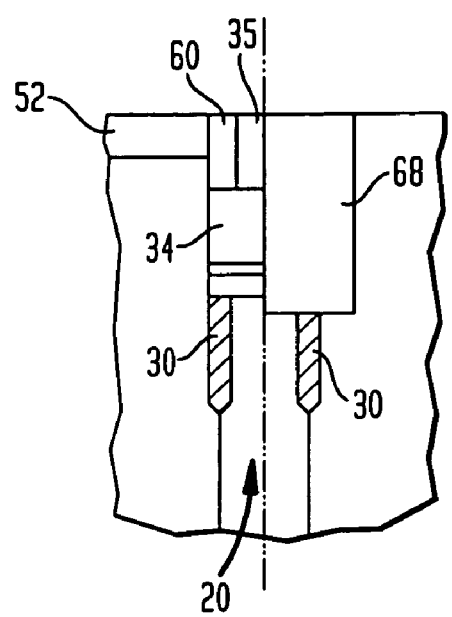

As illustrated in FIG. 6B, the isolation trench 10 is then filled with an insulating oxide 68 and then planarized. The hard mask 62, shown in FIG. 6A, is then removed, and the trench oxide 68 and nitride spacer 60 are planarized to the top of nitride layer 52.

Figure 6C:
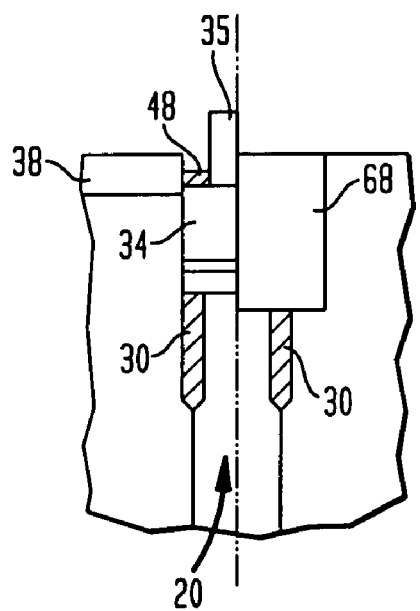

Referring to FIG. 6C, the nitride layer 52 and nitride spacer 60 are substantially removed to leave a nitride cap 48. The isolation trench oxide 68 is also partially etched back to remove any residual oxide layer on the nitride surface and may leave a gate polysilicon stud 35 which extends out above the surface of the nitride and oxide layers. A sacrificial oxide layer is then formed (not shown) and is followed by an ion implantation step to form the doped regions of the planar support circuits as well as the doped junction regions 38, shown in FIG. 2, of the vertical gate transistor 24. The sacrificial oxide layer is then removed prior to further processing. During each thermal step, such as the annealing step after the ion implantation step, the dopants within the polysilicon layer 54 in the trench diffuse out into the bulk silicon surrounding the trench to form the buried strap or doped junction 28 shown in FIG. 2.

Figure 6D:
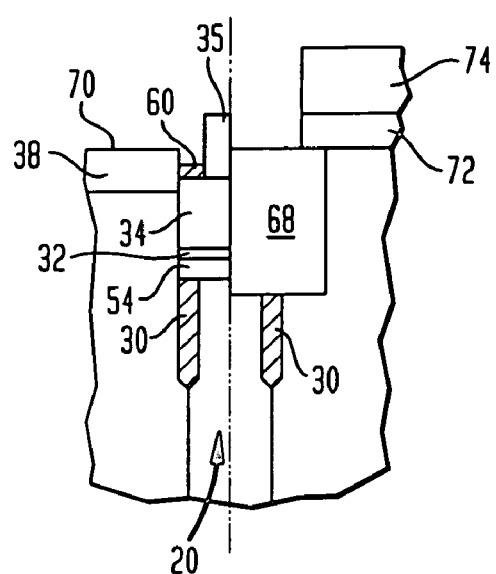

As shown in FIG. 6D, a planar device gate oxide 70 is then formed, and a polysilicon layer 72 is then deposited to form the gate polysilicon layer in the support regions. The polysilicon layer 72 is then patterned using known photolithographic and etching processes. An etch array (EA) mask pattern 74 exposes the active area and deep trench regions to the polysilicon etch while covering the support regions where the planar devices are formed. The resulting polysilicon layer 72 covers only the support regions.

Figure 6E:
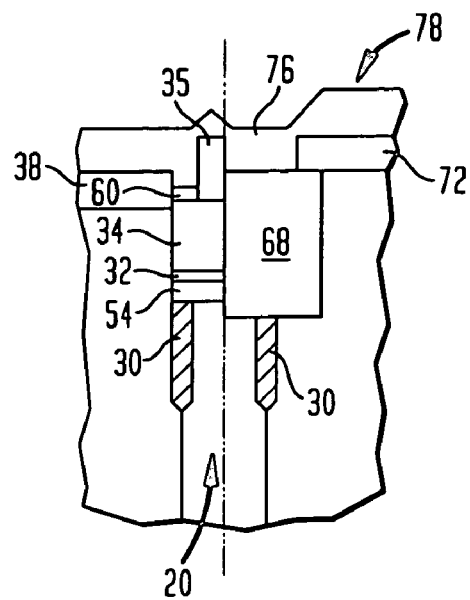

A thick oxide layer 76 is then deposited and patterned using an etch support (ES) mask layer 78, shown in FIG. 6E. The ES mask layer 78 covers the array regions and exposes the support regions so that the oxide layer 76 is etched away in the regions where the polysilicon layer 72 is present and remains only over the memory array areas, though there may be some overlap between the resulting polysilicon layer 72 and the thick oxide layer 76.

Figure 6F:
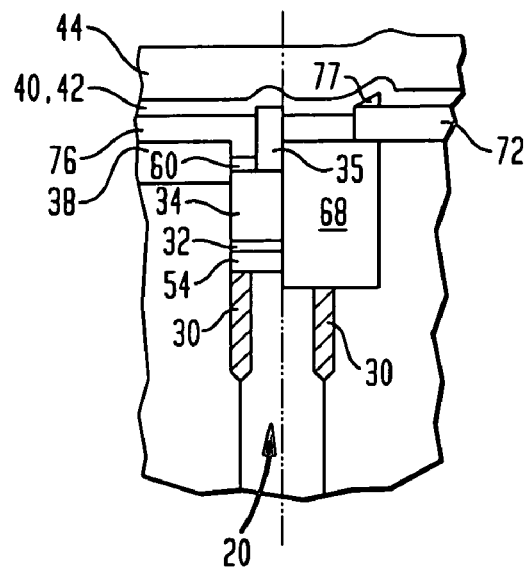

The thick oxide layer 76 is then planarized, resulting in a planar top oxide surface below the level of gate polysilicon stud 35 and the polysilicon layer 72, as shown in FIG. 6F. A portion 77 of the thick oxide layer 76 may remain atop the polysilicon layer 72 when the oxide layer 76 is not etched back entirely in the active regions but appreciably does not degrade performance or yield.

After planarizing the thick oxide layer 76, an oxide clean step is performed to remove any oxide that has been formed over the gate polysilicon 35 so that the word line conductor stack may be formed. The word lines are preferably a multi-layer stack formed of the polysilicon layer 40 and the tungsten layer 42, shown in FIG. 2. Alternatively, the conductors can be formed of a single layer or a combination of layers comprising polysilicon, tungsten, tungsten nitride, tungsten silicon, tantalum nitride, silicided silicon or other well known alternatives. A nitride cap 44 is then formed over the conductor stack.

Figure 6G:
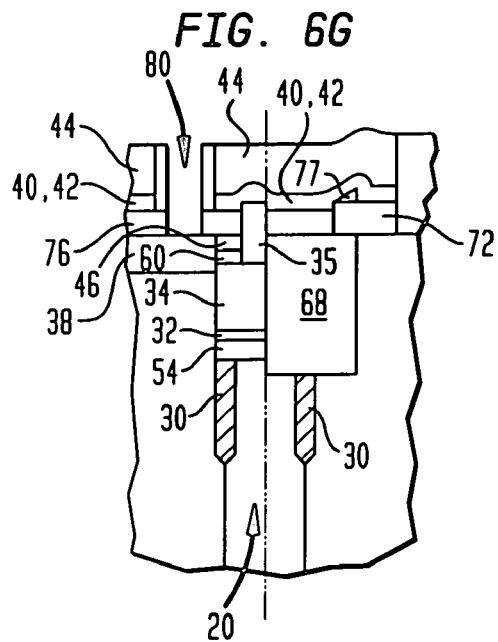

In FIG. 6G, the formation of the word line/support gate stack is illustrated. Oxide and nitride spacers are formed on the sides of the gate stack, and device implants are applied into the support regions.

Figure 6H:
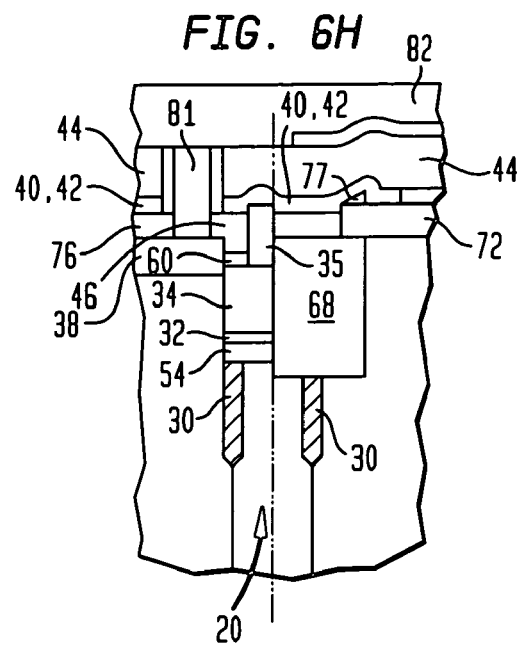

In FIG. 6H, the openings between the patterned gate stacks and the openings 80 between the word lines are filled with a doped glass 81, and the surface is planarized down to the top of the nitride layer 44 using a CMP step. An insulating film (not shown), known as a M0 insulating film that is typically a deposited $SiO_2$ film, is deposited atop the remaining doped glass 81, such as which fills openings 80, and atop the gate conductor nitride layer 44. An oxide-etch resistant material 82, such as a silicon nitride ($Si_3N_4$) layer, is then deposited atop the M0 insulating film. Then, a layer of resist is deposited, and a bit line (M0) mask step is carried out. The mask pattern is then etched into the oxide-etch resistant material, and the resist layer is stripped. The oxide-etch resistant material then serves to mask an etching step of the underlying oxide layer so that the doped glass 81 that fills the opening 80 between the gate conductors (word lines) and the doped oxide underneath the oxide-etch resistant material 82 are etched down to the doped silicon region 38. In this manner, the bit line contacts land on the active area diffusions.

In the support area, the etch stops on the nitride layer, whereas for the bit lines in the array, the etch reaches the drain region 38. The oxide spacer 46, the nitride cap 44, 48, and the nitride cap 60 prevent the bit line contact, and hence the bit line, from contacting the gate polysilicon layer 34 even when the M0 mask is misaligned.

Figure 6I:
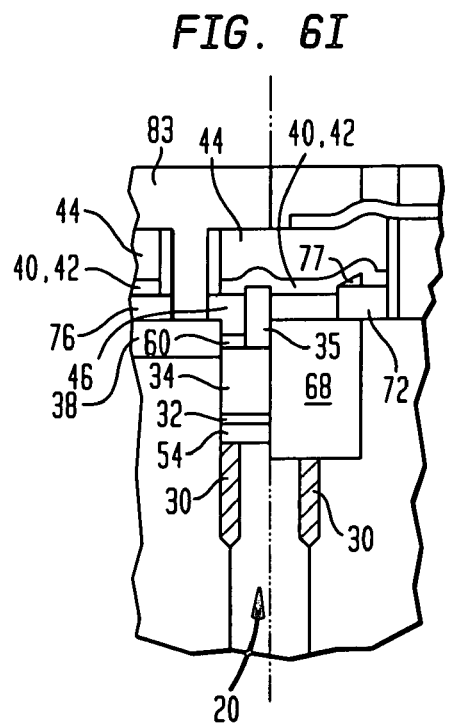

Thereafter, as shown in FIG. 6I, the bit line and contact regions 80 are filled with a conductor 83. The bit lines may be formed of a single conductor layer or a combination of conductor layers.

The known trench DRAM process has the disadvantage that the mask pattern for the isolation trench consists of a series of closely spaced segmented lines. As semiconductor devices become increasingly smaller, the segmented line mask patterns likewise become smaller and become increasingly difficult to print because of line shortening effects and because of the limited size of the open areas that can be printed using the masks. Further, as devices become smaller, the vertical transistors formed using the known process become increasingly prone to problems caused by cross-talk between the vertical transistors, such as back-gating and floating wells.

The present invention therefore provides a DRAM in which the active areas in the memory cell array are delimited by isolation trenches that are formed using a line mask consisting of equal lines and spaces that may extend across the entire length of the memory cell array. The lines and spaces mask eliminates the line shortening effects present when line segment masks are used. Regularly spaced deep trench patterns also serve to cut off the end of the active areas instead of the line segments. Also, a cut mask is used to permit the formation of vertical transistors on only one side of the deep trench or on alternating sides of adjacent deep trenches.

FIGS. 7A through 7E illustrate the patterns that are formed in a portion of a device substrate to define the DRAM memory cells in accordance with an embodiment of the invention.

Figure 7A:
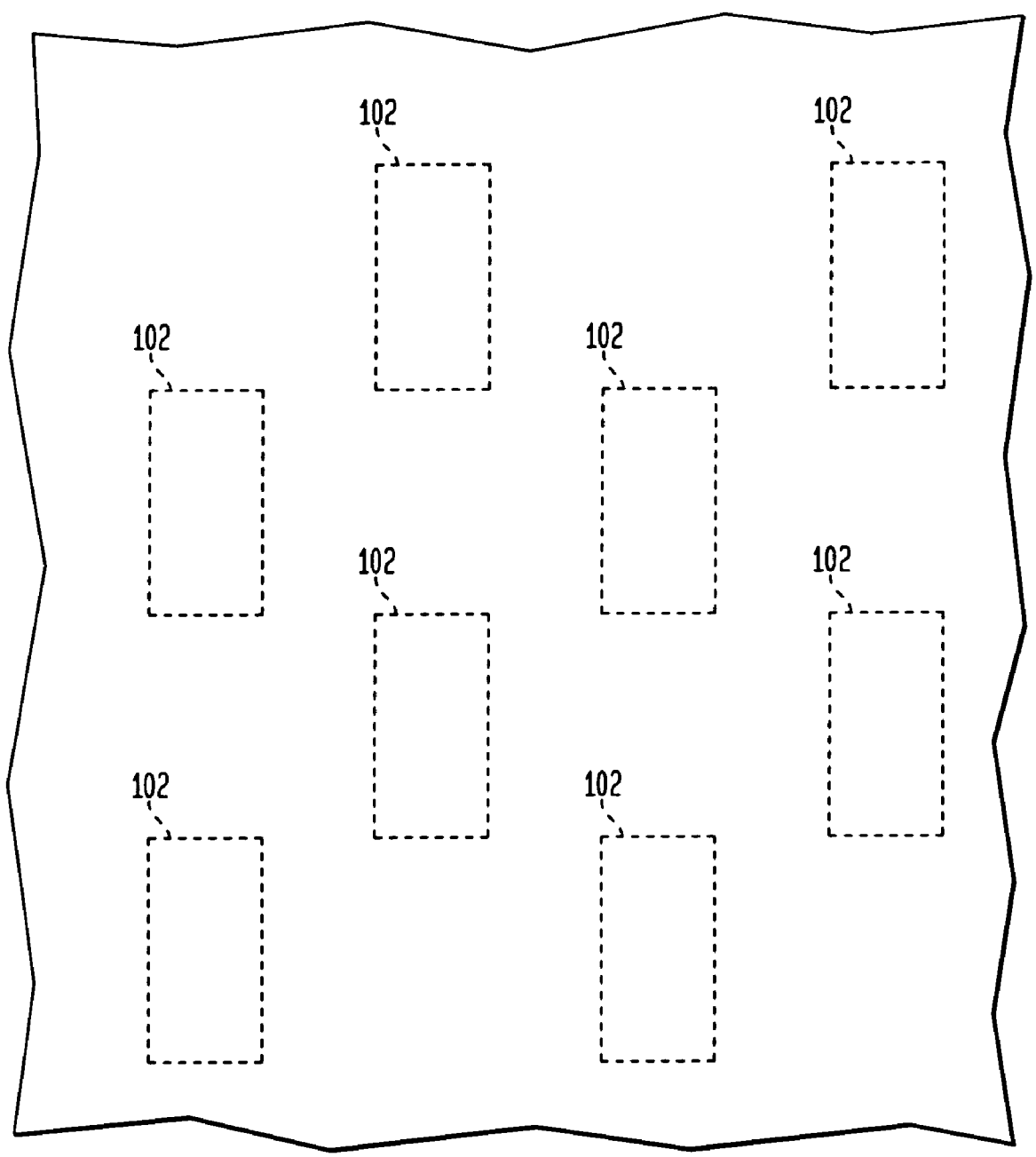
FIGS. 7A through 7E illustrate patterns formed in a substrate using a process in accordance with an embodiment of the invention.
Figure 7B:
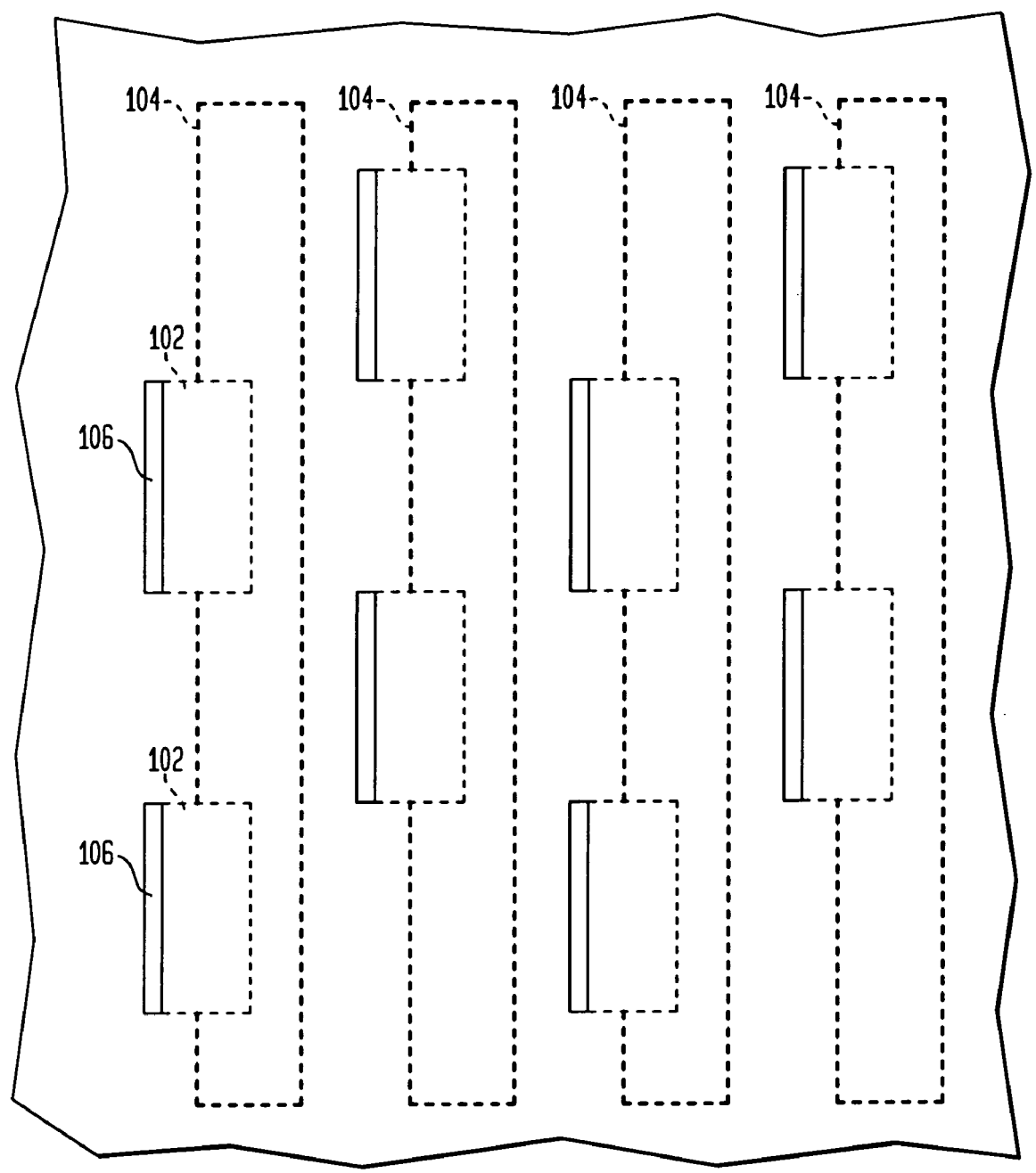

FIG. 7A illustrates a plurality of deep trenches 102 formed in a substrate using the process steps described above with reference to FIG. 4A. The deep trenches are etched and partially filled with polysilicon and the trench collar oxide layer is deposited along the side walls of the deep trenches in the manner described above. However, a lithographic step is carried out prior to etching back the trench collar oxide layer to form a patterned resist layer according to a cut mask pattern 104, shown in FIG. 7B. The patterned resist layer protects one side of each trench 102 during the etch back of the trench collar oxide layer so that the oxide is etched only along the unprotected side of the deep trench. Typically, the cut mask pattern has a pitch of twice the minimum feature size when the width of the deep trench is patterned at the minimum feature size and the pitch of the deep trenches is likewise twice the minimum feature size.

Figure 8A:
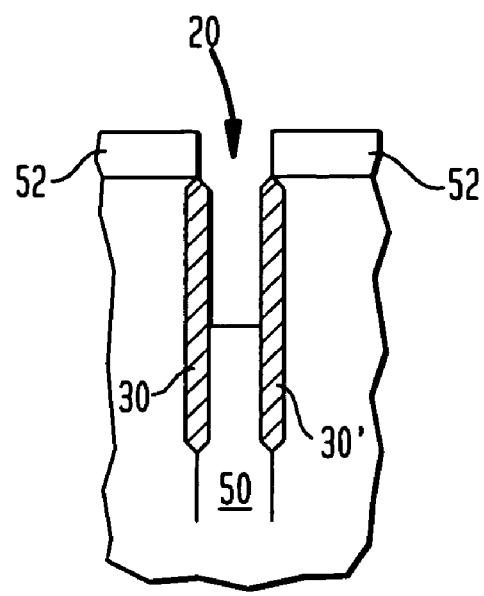
FIGS. 8A and 8B are cross-sectional views showing a portion of a memory cell in accordance with the process of FIGS. 7A-7E.
Figure 8B:
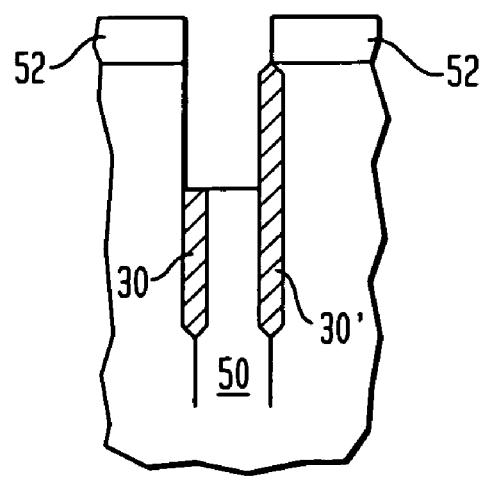

FIGS. 8A and 8B provide a cross-sectional view of the cut-masking step. FIG. 8A shows the deep trench structure prior to etch back of the trench collar oxide layer 30 and is similar to that depicted in FIG. 4A. The cut mask resist pattern (not shown), however, protects portion 30' of the trench collar oxide layer 30 so that portion 30' remains after the etch back, as FIG. 8B shows. The remaining portion 30' serves as a barrier for the diffusion of dopants from the polysilicon layer 50 into the walls of the deep trench and prevents the subsequent formation of a buried strap region along that side of the trench. As a result, the vertical transistors are only formed along the unprotected side of the trench with the single-sided strap 106, shown in FIG. 7B.

Figure 7C:
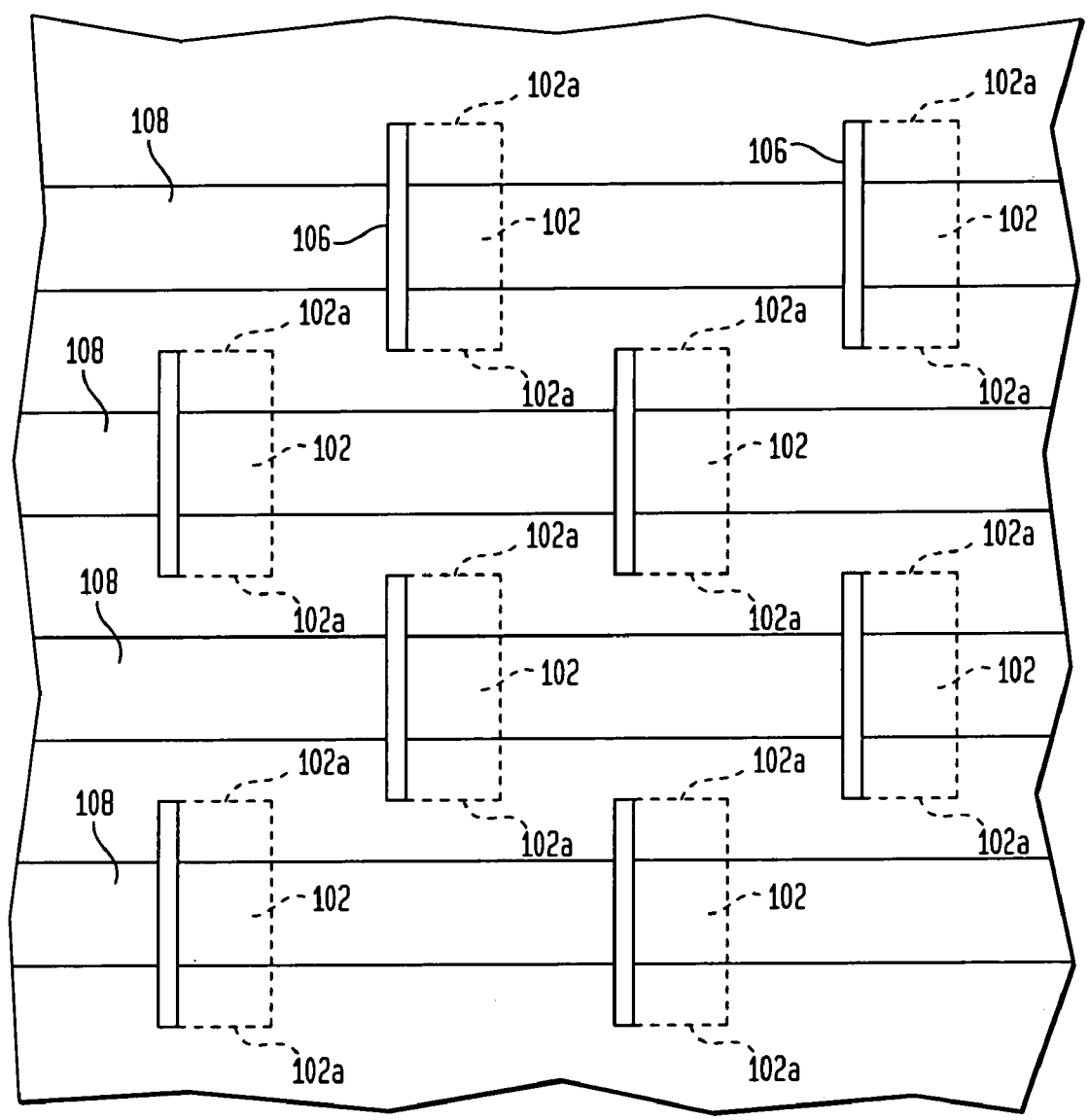

Thereafter, the patterned resist layer is removed, and process steps are carried out as described above in connection with FIGS. 4C to 4E. Then, a hard mask layer is deposited, and the hard mask layer is patterned according to a line mask comprised of an equal lines and spaces pattern, as FIG. 7C shows. The regions 108 represent the portions of the hard mask layer that remain after patterning and etching using the equal lines and spaces mask and which serve to protect the regions underlying it from the subsequent etch step that forms the isolation trench regions. The end portions 102a of the deep trenches 102 are thus etched below the buried strap region during the isolation trench etch. The region underlying the hard mask layer remains to form the active area (AA) regions and the remaining part of the deep trenches which also divide the AA regions.

The lines and spaces pattern 108 may extend across the entire memory cell array, though only a portion is shown in FIG. 7C. Because a lines and spaces pattern is used in place of the line segment pattern of the known process, the patterning of the isolation trench regions is not prone to line shortening as is often present with smaller feature size line segment patterns. Further, the equal lines and spaces pattern permits respective active area regions and respective deep trenches to be closer to one another. Additionally, the formation of buried strap regions, and thereby the formation of transistors, along only one side of the trenches permit these more closely spaced regions to be formed with less likelihood of back-gating between adjacent transistors and floating wells. Because the likelihood of back-gating between adjacent transistors and floating wells is minimized, the isolation trenches may be made shallower and are thus easier to define, simpler to etch, may be filled in a more straightforward manner, and may be planarized more readily.

Figure 7D:
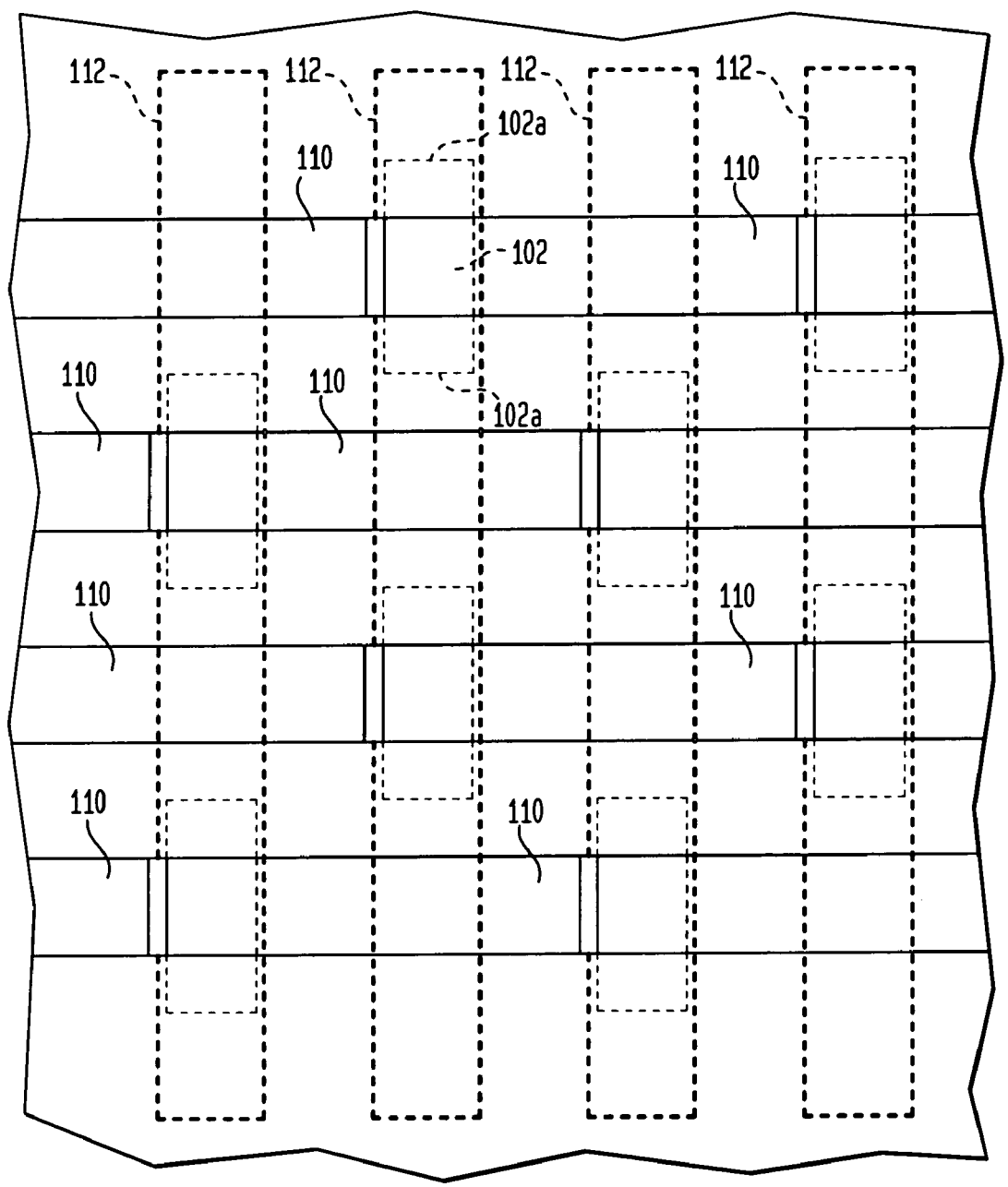

FIG. 7D shows the active area regions 110 and the remaining portions of the deep trenches 102 after the etching of the isolation trenches. Also shown is a gate contact pattern 112 that is used to define the word line/support gate stack that is formed thereon after the memory cell array is further processed in the manner described above with reference to FIGS. 6B through 6G.

Figure 7E:
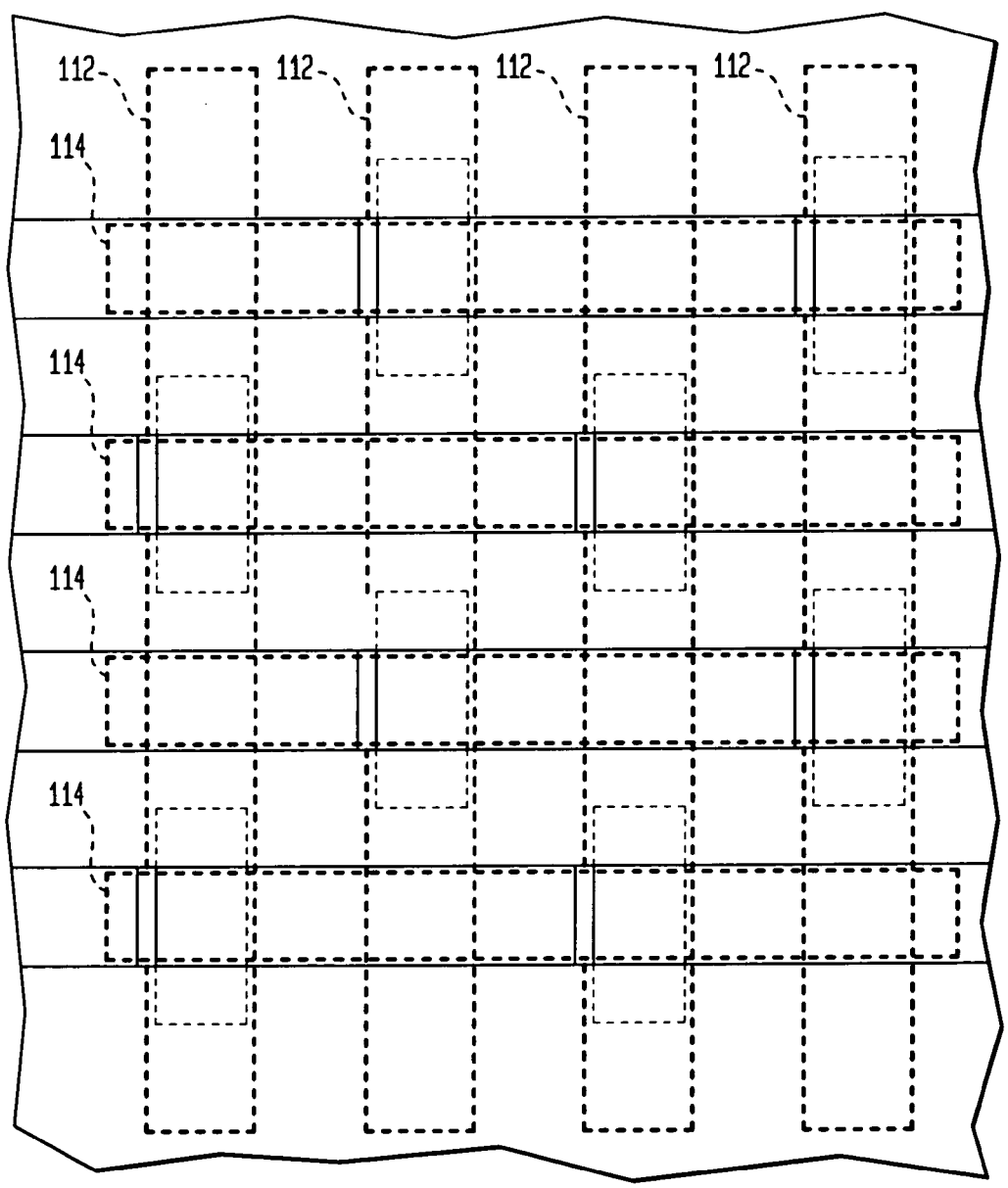

Thereafter, the memory cell array is processed as described above in connection with FIG. 6H using a bit line contact (M0) masking pattern 114 shown in FIG. 7E and is further processed as described above with reference to FIG. 6I.

Figure 9:
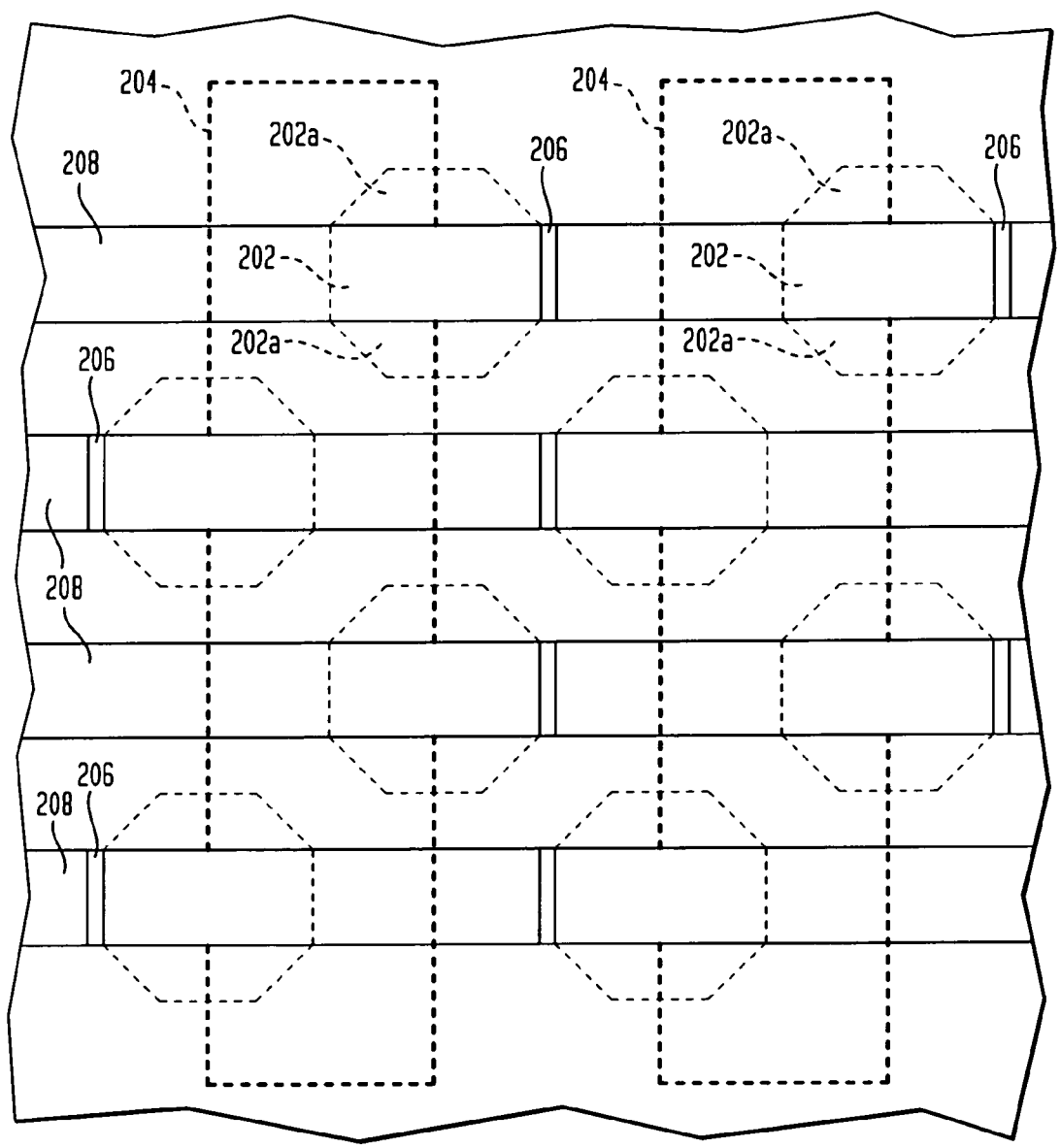
FIG. 9 shows patterns formed in a substrate using a process in accordance with another embodiment of the invention.

FIG. 9 illustrates another embodiment of the invention in which the cut mask pattern 204 has a pitch of four times the minimum feature size. The memory cell array is formed in the manner described above with reference to FIGS. 7A to 7E. However, larger deep trench patterns 202 are required because of the greater pitch in the cut mask pattern 204. Typically, the deep trench patterns 202 are octagonal or bottle-shaped. A lines and spaces pattern 208 that extends across the entire memory cell array is used to define the isolation trenches, as described above, so that regions 202a are etched to below the buried strap region and only a portion of the deep trench patterns 202 remain after the isolation trenches are etched. The remaining portion of the deep trenches 202 together with the isolation trenches, delimit the active area regions.

Because of the larger pitch of the cut mask pattern 204 and the larger deep trench patterns 202, the cut mask pattern and the deep trench patterns may be printed much more easily and with greater process tolerance. However, the deep strap regions are more closely spaced to each other and require deeper isolation trenches.

In the known process described above with reference to FIGS. 4A-4E, 5A-5B and 6A-6I, a line mask is used to define the bit line contact regions that provide contacts between the bit lines and the drain regions of the memory cell array. The bit lines are defined by the subsequent first metal or bit line (M0) mask pattern. The bit line mask pattern may be a separate mask level from the M0 mask level or may be defined by the M0 mask pattern in conjunction with a block mask pattern.

The known line mask bit line contact pattern has the disadvantage that as the feature sizes are decreased, the memory cells formed using these contact patterns are prone to increased bit line-to-word line capacitances as well as to increased bit line-to-bit line capacitances. The increased capacitances are caused by the increased wrapping of the bit line contact regions around the word line such that there are effectively two bit line contact regions for each cell.

Figure 10:
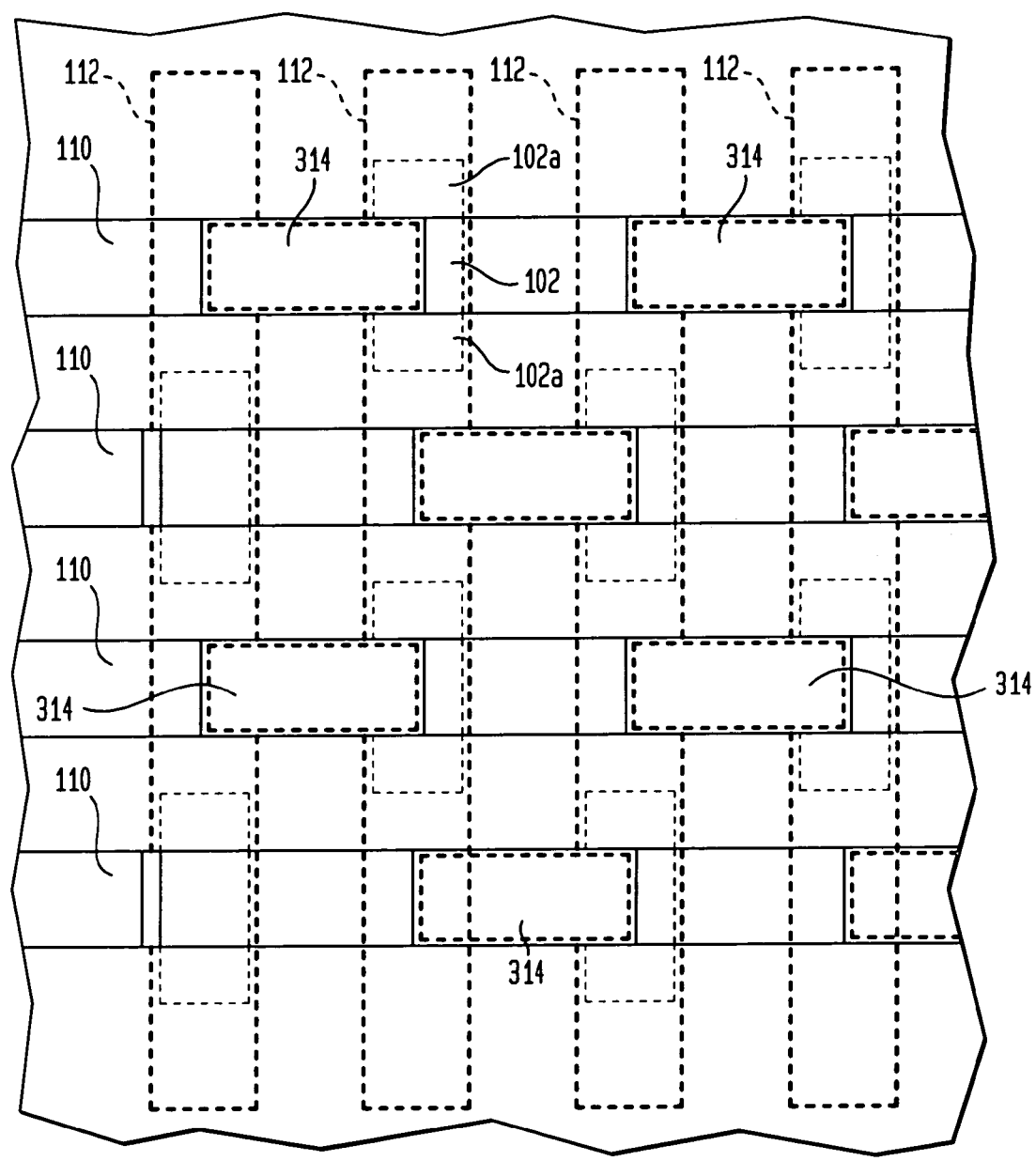
FIG. 10 shows patterns formed in a substrate using a process in accordance with yet another embodiment of the invention.

FIG. 10 illustrates an additional embodiment of the invention in which the known line mask bit line contact pattern is replaced with a bit line contact pattern that defines contact regions only on the side of the deep trench where the vertical transistor is formed. The memory cells are fabricated in the manner described above in connection with FIGS. 7A to 7E, where like numerals represent the same mask patterns, except that the bit line contact regions are defined by the patterns 314 shown in FIG. 10 using an additional mask level. The presence of the contact region on only one side of the conductor reduces the bit line-to-word line capacitance and improves performance of the memory device.

FIGS. 11A-11E illustrate the process for forming a device structure using the pattern shown in FIG. 10. First, as FIG.

11A shows, the device is processed in the manner described above with reference to FIGS. 4A-4B, 5A-5B and 6A-6G, except that the cut-masking step described above with reference to FIGS. 7A-7D and 8A-8B is carried out. The resulting structure is similar to that shown in FIG. 2 with like reference numerals representing like structures except that the buried strap region 28 and the gate dielectric layer 36 are present on only one side of the deep trench. On the opposite side of the deep trench, the collar oxide 30 is not etched and extends up to the top surface of the silicon substrate.

Figure 11A:
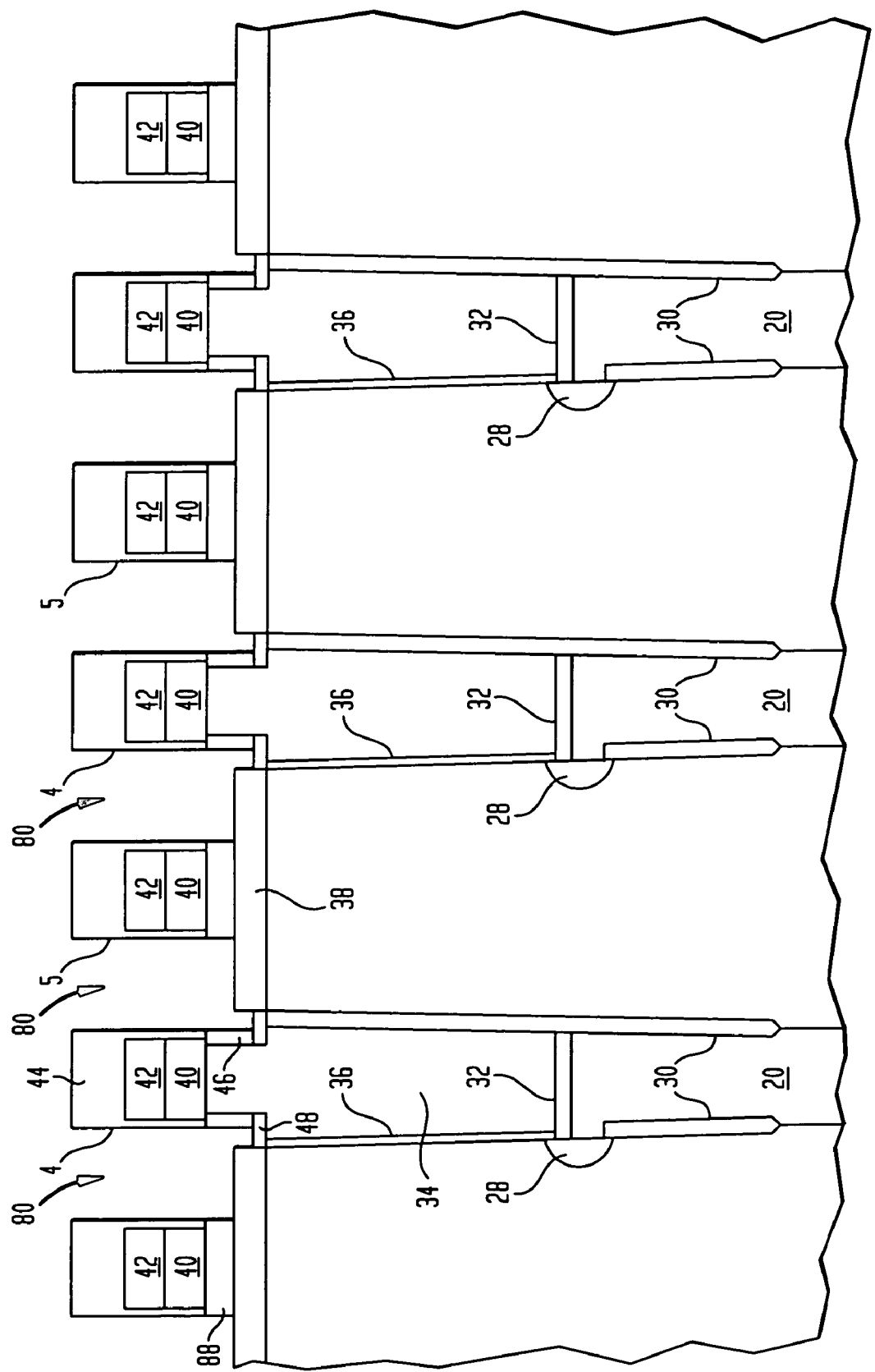
FIGS. 11A-11E illustrate steps of a process for forming the embodiment of FIG. 10.
Figure 11B:
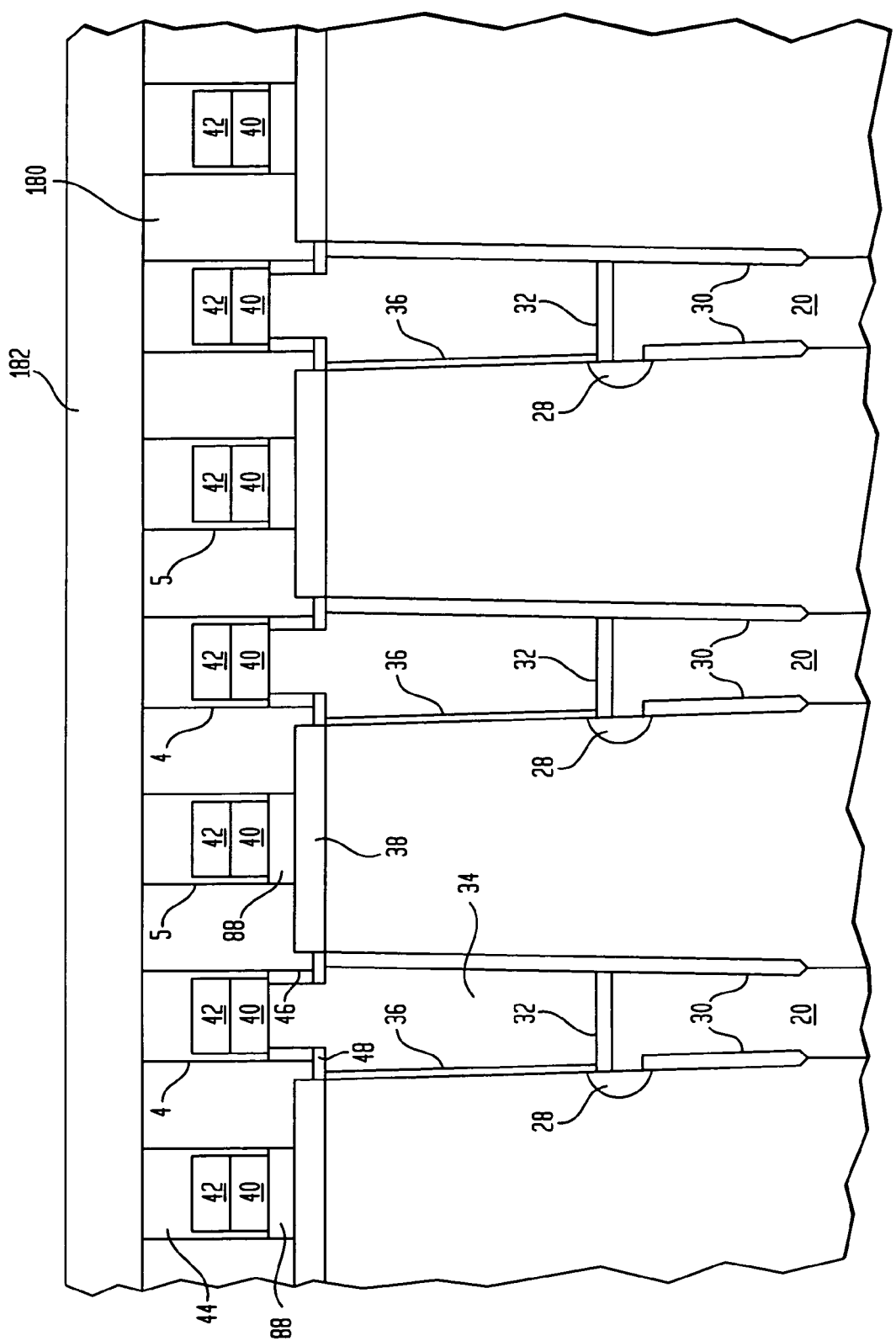

Next, as shown in FIG. 11B, the openings 80 between the gate stack structures 4 and 5 are filled with a doped glass 180, such as BPSG, which is then planarized down to the top of the nitride layer 44 of the stacks 4 and 7 using a CMP step. A bit line insulator material 182, such as TEOS, is then deposited atop the planarized doped glass 180 and the nitride layer 44.

Figure 11C:
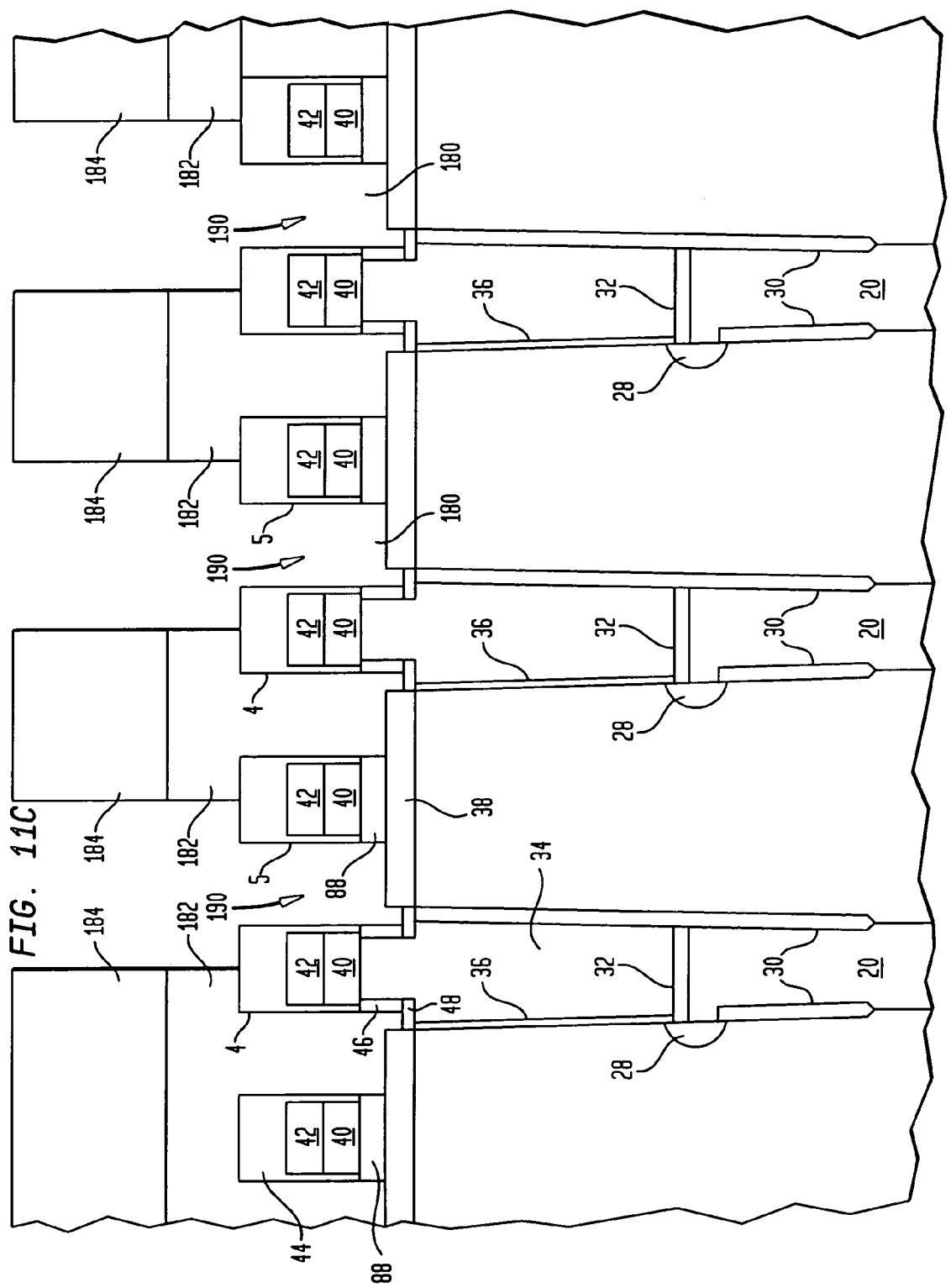

Then, as FIG. 11C shows, a resist layer 184 is deposited and patterned to form the bit line contact (CB) pattern in which openings in the resist are formed only on the side of the deep trench in which the vertical transistor is present. The patterned resist layer 184 then masks an etching step of the bit line insulator layer 182 and of the doped glass layer 180 to form openings, known as vias 190, down to the drain regions 38 in the silicon substrate on the one side of the deep trench. The etching of the doped oxide layer 180 is carried out using a selective etching process that leaves the gate conductor insulators 44.

Figure 11D:
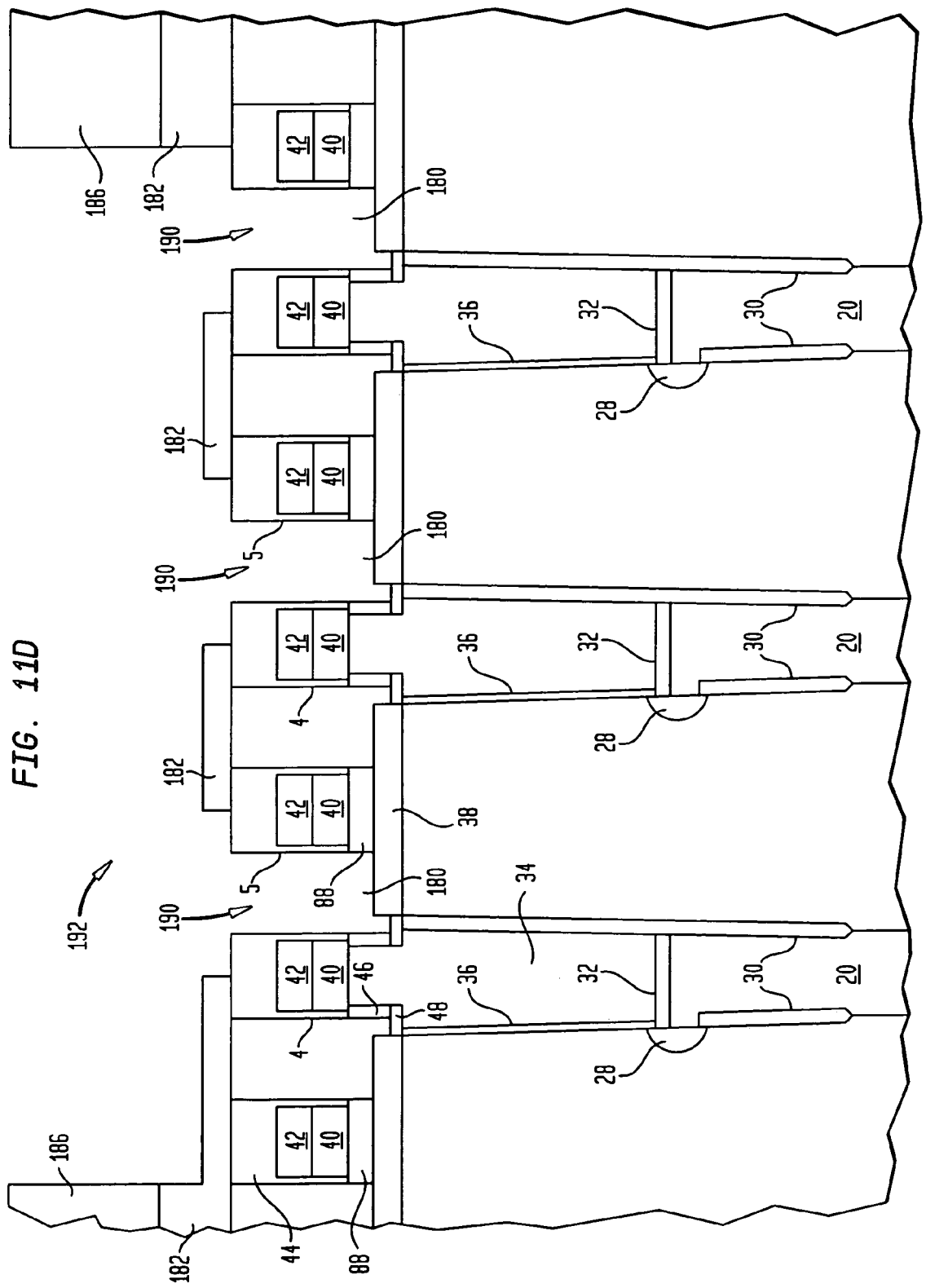

Next, as shown in FIG. 11D, the resist layer 184 is removed, if not removed previously by the etching of the layers 180 and 182, and a further resist layer 186 is deposited and is patterned using a bit line (M0) masking pattern. The openings in the resist layer 186 then serve to mask a further etching of the exposed regions of the bit line insulator material 182. The insulator material 182 is only etched partially to form a bit line trough 192 in the bit line insulator layer 182. The resist layer 186 is then removed.

Figure 11E:
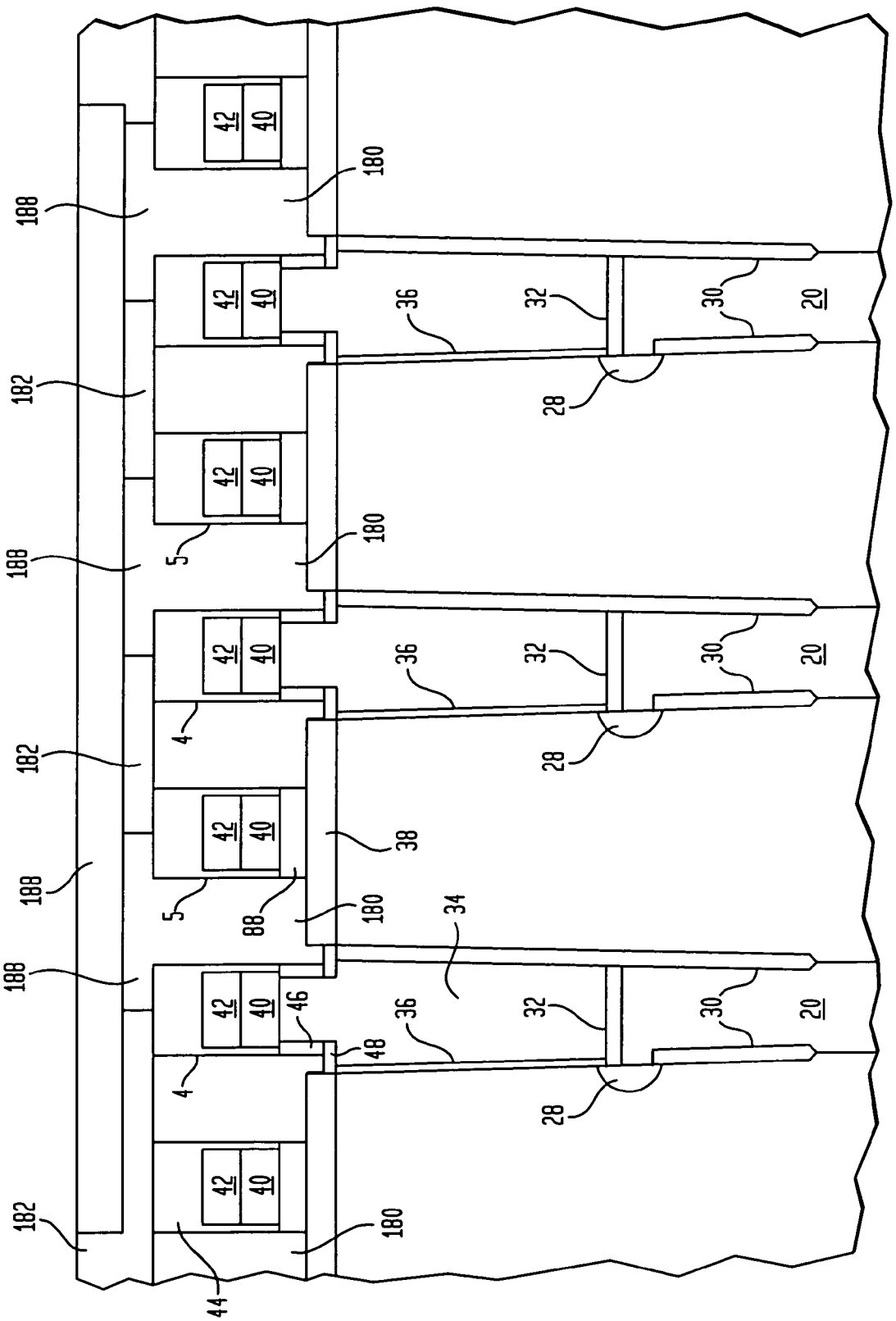

Thereafter, as FIG. 11E shows, a metal layer 188 is deposited that fills the vias 190 and the bit line trough 192. The metal layer 188 is then planarized down to the top surface of the bit line insulator layer 182, such as using a CMP step or a damascene process.

The process shown in FIGS. 11A-11E results in a bit line contact region that is defined by the bit line (M0) troughs and by the spaces between the word lines. With the bit line troughs nearly coincident with the active areas, as defined by the active area mask, the bit line contacts land in a self-aligned manner on the doped active area regions not covered by the word line and are not interrupted or cut by the deep trenches. In this manner, the bit line contacts are defined by the intersection of structures defined by the line masks, and not by a contact mask which may be difficult to image.

The bit line contact regions are therefore separated by a distance $(F^2+F^2)^{1/2}=1.73F$, where F is the minimum feature size, and are easier to print. Also, as FIG. 11C shows, the bit line contact regions may be elongated in a direction parallel to the active area regions and thus overlap above the adjacent word line without extending over to the other side of the word line.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A semiconductor memory device comprising:
an array of memory cells arranged in an array of rows and columns at a surface of a semiconductor body, each memory cell comprising:
a trench disposed within the semiconductor body;
a conductive material filling at least a lower portion of the trench;
a dielectric material lining sidewalls of the trench such that the conductive material filling the trench forms a first plate of a capacitor and semiconductor material of the semiconductor body forms a second plate of the capacitor, the second plate of the capacitor being electrically coupled to capacitors of other memory cells within the array;
a trench collar lining a portion of a sidewall of the trench above the dielectric material;
a pass transistor having a first source/drain region and a second source/drain region, the first source/drain region being electrically coupled to the conductive material through an opening in the trench collar, the opening formed at one side of the trench such that an asymmetric trench structure is formed;
a plurality of wordlines extending along the rows of the array of memory cells, each wordline being electrically coupled to a gate of every other memory cell along the row;
a plurality of bitlines extending along the columns of the array of memory cells, each bitline being electrically coupled to the second source/drain region of every other memory cell along the column; and
a plurality of isolation regions extending parallel to the plurality of bitlines and disposed between columns of the array of memory cells, each isolation region comprising a rectangular strip of insulating material that extends between adjacent columns of the memory cells, wherein adjacent ones of the memory cells within a column are isolated without use of the isolation regions.

2. The device of claim 1, wherein each isolation region has a width and is separated from a parallel isolation by a spacing distance, wherein the width is equal to the spacing distance.

3. The device of claim 1, wherein adjacent ones of the trenches are separated by a distance 3F, where F is a minimum feature size.

4. The device of claim 1, wherein each pass transistor comprises a vertical transistor.

5. The device of claim 1, wherein, for each memory cell, the second source/drain region is located at the surface of the semiconductor body and the first source/drain region is located within the semiconductor body spaced from the surface.

6. The device of claim 1, wherein the conductive material filling at least the lower portion of the trench comprises doped polysilicon.

7. The device of claim 1, wherein the second plate of the capacitor comprises a doped region of the semiconductor body that extends beneath ones of the trenches.

* * * * *

UNITED STATES PATENT AND TRADEMARK OFFICE
CERTIFICATE OF CORRECTION

PATENT NO. : 7,244,980 B2 Page 1 of 1
APPLICATION NO. : 10/774827
DATED : July 17, 2007
INVENTOR(S) : Weis et al.

It is certified that error appears in the above-identified patent and that said Letters Patent is hereby corrected as shown below:

In Col. 14, line 29, delete "cach" and insert --each--.

Signed and Sealed this

Thirteenth Day of November, 2007

JON W. DUDAS
*Director of the United States Patent and Trademark Office*